(12) United States Patent
Cencini et al.

(10) Patent No.: US 10,404,523 B2
(45) Date of Patent: Sep. 3, 2019

(54) DATA CENTER MANAGEMENT WITH RACK-CONTROLLERS

(71) Applicant: Vapor IO Inc., Austin, TX (US)

(72) Inventors: Andrew Brian Cencini, Austin, TX (US); Steven White, Austin, TX (US); Cole Malone Crawford, Austin, TX (US)

(73) Assignee: Vapor IO Inc., Austin, TX (US)

( * ) Notice: Subject to any disclaimer, the term of this patent is extended or adjusted under 35 U.S.C. 154(b) by 15 days.

(21) Appl. No.: 15/366,554

(22) Filed: Dec. 1, 2016

(65) Prior Publication Data

US 2017/0085413 A1    Mar. 23, 2017

Related U.S. Application Data

(63) Continuation-in-part of application No. 15/065,212, filed on Mar. 9, 2016, now Pat. No. 10,117,360.

(60) Provisional application No. 62/130,018, filed on Mar. 9, 2015, provisional application No. 62/248,788, filed on Oct. 30, 2015, provisional application No. 62/275,909, filed on Jan. 7, 2016.

(51) Int. Cl.
| | |
|---|---|
| *G06F 1/26* | (2006.01) |
| *G06F 9/44* | (2018.01) |
| *H04L 12/24* | (2006.01) |
| *G06F 9/4401* | (2018.01) |
| *H05K 7/14* | (2006.01) |
| *H05K 7/20* | (2006.01) |
| *G06F 1/18* | (2006.01) |
| *G06F 1/20* | (2006.01) |

(52) U.S. Cl.
CPC ............ *H04L 41/044* (2013.01); *G06F 1/189* (2013.01); *G06F 1/206* (2013.01); *G06F 1/26* (2013.01); *G06F 9/4408* (2013.01); *G06F 9/4416* (2013.01); *H05K 7/1497* (2013.01); *H05K 7/20145* (2013.01); *H05K 7/20745* (2013.01)

(58) Field of Classification Search
None
See application file for complete search history.

(56) References Cited

U.S. PATENT DOCUMENTS

| | | |
|---|---|---|
| 5,063,475 A | 11/1991 | Balan |
| 6,133,526 A | 10/2000 | Lebo et al. |

(Continued)

OTHER PUBLICATIONS

Ongaro et al., "In Search of an Understandable Consensus Algorithm", http://files.catwell.info/misc/mirror/raft/raft.pdf, May 22, 2013, pp. 1 to 14.

(Continued)

*Primary Examiner* — Danny Chan
(74) *Attorney, Agent, or Firm* — Pillsbury Winthrop Shaw Pittman LLP

(57) ABSTRACT

Provided is a process, including: receiving, with a rack-controller, via a first network, an application program interface (API) request; based on the API request, selecting, with the rack-controller, one of a plurality of routines to effectuate control via the second network of at least some of the plurality of rack-mounted computing devices; executing, with the rack-controller, the selected routine and, as a result, sending one or more commands via the second network encoded in a second protocol different from the first protocol to effectuate an action indicated by the API request.

48 Claims, 9 Drawing Sheets

(56) References Cited

U.S. PATENT DOCUMENTS

| | | |
|---|---|---|
| 7,133,289 B2 | 11/2006 | Arippol |
| 7,426,110 B2 | 9/2008 | Malone et al. |
| 7,508,663 B2 | 3/2009 | Coglitore |
| 7,573,715 B2 | 8/2009 | Mojaver et al. |
| 7,688,593 B2 | 3/2010 | Byers et al. |
| 7,697,305 B2 | 4/2010 | Meyer et al. |
| 7,907,402 B2 | 3/2011 | Caveney |
| 8,198,998 B1 | 6/2012 | Propp et al. |
| 8,297,067 B2 | 10/2012 | Keisling et al. |
| 8,320,125 B1 | 11/2012 | Hamburgen et al. |
| 8,867,204 B1 | 10/2014 | Gardner |
| 9,001,456 B2 | 4/2015 | Campbell et al. |
| 9,625,978 B2* | 4/2017 | Kutch ................ G06F 1/3287 |
| 2002/0098792 A1 | 7/2002 | Hsiao |
| 2002/0149911 A1 | 10/2002 | Bishop et al. |
| 2003/0031449 A1 | 2/2003 | Simmons et al. |
| 2004/0132398 A1 | 7/2004 | Sharp et al. |
| 2005/0198359 A1 | 9/2005 | Basani et al. |
| 2005/0201073 A1 | 9/2005 | Pincu et al. |
| 2006/0209475 A1 | 9/2006 | Cabrera et al. |
| 2006/0215363 A1 | 9/2006 | Shipley et al. |
| 2007/0019613 A1 | 1/2007 | Frezzolini |
| 2007/0064383 A1 | 3/2007 | Tanaka et al. |
| 2008/0151497 A1 | 6/2008 | Lai et al. |
| 2008/0266077 A1 | 10/2008 | Cagno et al. |
| 2009/0024764 A1 | 1/2009 | Atherton et al. |
| 2009/0251860 A1 | 10/2009 | Belady et al. |
| 2009/0259734 A1 | 10/2009 | Morikawa |
| 2009/0259741 A1 | 10/2009 | Shen et al. |
| 2009/0308579 A1 | 12/2009 | Johnson et al. |
| 2010/0034297 A1 | 2/2010 | Takasu |
| 2010/0102937 A1 | 4/2010 | Swenson et al. |
| 2010/0151781 A1 | 6/2010 | Slessman et al. |
| 2010/0317278 A1 | 12/2010 | Novick |
| 2011/0116226 A1 | 5/2011 | Yang |
| 2011/0014862 A1 | 8/2011 | Honold et al. |
| 2011/0317971 A1 | 12/2011 | Zhang et al. |
| 2012/0016290 A1 | 1/2012 | Shin |
| 2012/0103843 A1 | 5/2012 | Wei |
| 2012/0111817 A1 | 5/2012 | Sweeny et al. |
| 2012/0128507 A1 | 5/2012 | Scheidler |
| 2012/0134096 A1 | 5/2012 | Zhang |
| 2012/0166693 A1 | 6/2012 | Weinstock et al. |
| 2012/0275084 A1 | 11/2012 | Familiant et al. |
| 2013/0013759 A1* | 1/2013 | Austen ............ H04L 29/08099 709/223 |
| 2013/0031411 A1* | 1/2013 | Chou ................ G06F 11/2284 714/30 |
| 2013/0107450 A1 | 5/2013 | Zhang et al. |
| 2013/0120931 A1 | 5/2013 | Sankar et al. |
| 2013/0133350 A1 | 5/2013 | Reytblat |
| 2013/0205069 A1 | 8/2013 | Delfatti et al. |
| 2013/0262700 A1 | 10/2013 | Tamura |
| 2013/0301649 A1 | 11/2013 | Vijayasankar et al. |
| 2014/0113539 A1 | 4/2014 | Dickinson et al. |
| 2014/0126143 A1* | 5/2014 | Dean .................. G06F 1/20 361/679.47 |
| 2014/0137491 A1 | 5/2014 | Somani et al. |
| 2014/0177163 A1 | 6/2014 | Wiley |
| 2014/0185225 A1 | 7/2014 | Wineland |
| 2014/0243999 A1 | 8/2014 | Hildebran et al. |
| 2014/0250292 A1* | 9/2014 | Edwards ............ G06F 9/4401 713/2 |
| 2014/0268528 A1 | 9/2014 | Mick |
| 2014/0281614 A1* | 9/2014 | Mick .................. G05D 23/1917 713/322 |
| 2014/0297855 A1 | 10/2014 | Moore et al. |
| 2015/0004679 A1 | 1/2015 | Conger et al. |
| 2015/0090679 A1 | 4/2015 | Obemesser et al. |
| 2015/0129514 A1 | 5/2015 | Bourdoncle et al. |
| 2015/0178064 A1 | 6/2015 | Cairns et al. |
| 2015/0178095 A1 | 6/2015 | Blalkrishnan et al. |
| 2015/0248315 A1* | 9/2015 | Ragupathi ........... H04L 41/0806 709/226 |
| 2015/0253028 A1* | 9/2015 | Masuyama ............ G05B 15/02 700/276 |
| 2015/0256386 A1 | 9/2015 | Palmer et al. |
| 2015/0289405 A1 | 10/2015 | Stewart et al. |
| 2015/0355969 A1 | 12/2015 | Hayes et al. |
| 2015/0363109 A1 | 12/2015 | Frick et al. |
| 2015/0381237 A1 | 12/2015 | Griffith et al. |
| 2016/0043873 A1 | 2/2016 | Wendt et al. |
| 2016/0099886 A1 | 4/2016 | Rao et al. |
| 2016/0107312 A1 | 4/2016 | Morrill et al. |
| 2016/0127167 A1* | 5/2016 | Chou .................. H04L 41/0226 709/223 |
| 2016/0127274 A1 | 5/2016 | Casado et al. |
| 2016/0182484 A1* | 6/2016 | Shih .................... H04L 63/083 726/6 |
| 2016/0203017 A1 | 7/2016 | Davenport et al. |
| 2016/0270262 A1 | 9/2016 | Crawford |
| 2016/0277503 A1 | 9/2016 | Hayes et al. |
| 2016/0294627 A1 | 10/2016 | Koponen et al. |
| 2016/0338220 A1 | 11/2016 | Crawford et al. |
| 2016/0359683 A1* | 12/2016 | Bartfai-Walcott ......................... H04L 41/5009 |
| 2017/0006576 A1 | 1/2017 | Barrett et al. |
| 2017/0031694 A1 | 2/2017 | Chu et al. |
| 2017/0085637 A1 | 3/2017 | Cencini et al. |
| 2017/0126506 A1 | 5/2017 | Padala et al. |
| 2017/0322613 A1* | 11/2017 | Lin ...................... G06F 1/3209 |

OTHER PUBLICATIONS

Lamport, Leslie, "The Part-Time Parliament", ACM Transactions on Computer Systems 16, 2, https://lamport.azurewebsites.net/pubs/lamport-paxos.pdf, May 1998, pp. 133 to 169.

"MongoDB", https://web.archive.org/web/20160301230628/https://www.mongodb.org/, Mar. 1, 2016, pp. 1 to 4.

"Intelligent Platform Management Interface", https://web.archive.org/web/20160117151407/https://en.wikipedia.org/wiki/Intelligent_Platform_Management_Interface, Jan. 17, 2018, pp. 1 to 4.

"Wireless data centers could be faster, cheaper, greener", http://www.news.cornell.edu/stories/2012/09/wireless-data-centers-could-be-faster-cheaper-greener, Sep. 26, 2012, pp. 1 to 2.

"Wild New Design: Data Center in A Silo", http://www.datacenterknowledge.com/archives/2009/12/10/wild-new-design-data-center-in-a-silo/, Dec. 10, 2009, pp. 1 to 6.

"Calcul gets creative with data center cooling design", http://searchdatacentertechtarget.com/photostory/2240169084/New-book-takes-you-inside-unique-energy-efficient-data-centers/3/Calcul-gets-creative-with-data-center-cooling-design, Oct. 23, 2012, pp. 1 to 3.

International Search Report & Written Opinion for Related Application PCT/US2016/021515, dated Jun. 17, 2016, pp. 1 to 13.

International Search Report & Written Opinion for Related Application PCT/US2016/021521, dated Jun. 20, 2016, pp. 1 to 13.

Non-Final Office Action for Related U.S. Appl. No. 15/065,201, dated Aug. 12, 2016, pp. 1 to 18.

Non-Final Office Action for Related U.S. Appl. No. 15/065,181, dated Jul. 22, 2016, pp. 1 to 25.

Non-Final Office Action for Related U.S. Appl. No. 15/165,590, dated Aug. 30, 2016, pp. 1 to 24.

International Search Report & Written Opinion for Related PCT Application PCT/US2016/034328, dated Aug. 24, 2016, pp. 1 to 12.

Restriction Requirement for Related U.S. Appl. No. 15/065,212, dated Sep. 11, 2017, pp. 1 to 23.

Non-Final Office Action for Related U.S. Appl. No. 15/065,212, dated Jan. 19, 2018, pp. 1 to 17.

Notice of Allowance for Related U.S. Appl. No. 15/065,212, dated Jun. 26, 2018, pp. 1 to 15.

Non-Final Office Action for Related U.S. Appl. No. 15/366,528 dated May 17, 2018, pp. 1 to 43.

Notice of Allowance for Related U.S. Appl. No. 15/366,528 dated Nov. 28, 2018, pp. 1 to .

\* cited by examiner

DATA CENTER MANAGEMENT WITH RACK-CONTROLLERS

CROSS-REFERENCE TO RELATED APPLICATIONS

The present application is a continuation-in-part of U.S. patent application Ser. No. 15/065,212, titled OUT-OF-BAND DATA CENTER MANAGEMENT VIA POWER BUS, filed 9 Mar. 2016, which claims the benefit of the following U.S. Provisional Patent Applications: U.S. 62/130,018, titled RACK FOR COMPUTING EQUIPMENT, filed 9 Mar. 2015; U.S. 62/248,788, titled RACK FOR COMPUTING EQUIPMENT, filed 30 Oct. 2015; and U.S. 62/275,909, titled RACK FOR COMPUTING EQUIPMENT, filed 7 Jan. 2016. The entire content of each parent application is incorporated by reference in its entirety.

BACKGROUND

1. Field

The present invention relates generally to computing equipment and, more specifically, to management networks for data centers.

2. Description of the Related Art

Data centers are often used to house and interconnect large collections of computing devices, like servers, databases, load balancers, and high-performance computing clusters. Often, the computing devices are interconnected with two different networks: 1) an in-band network for conveying the data upon which the computing devices operate, for example, content in webpages, queries and query responses, and data for high-performance computing; and 2) an out-of-band management network for conveying commands to the individual computing devices to manage their operation, e.g., for conveying information like sensor data indicative of the operation of the computing devices or for remote serial console sessions for server management.

Out-of-band management serves a number of purposes, depending on the context. Often, out-of-band management networks are used to manage security risk, by limiting the attack surface of a network that could be used to control the computing devices and segregating the in-band network that often receives data from the outside world. In some cases, out-of-band management networks are operative to control the computing devices even when the computing devices are turned off, for example, by accessing memory on computing devices that is persistent (like flash memory) to perform things like extensible firmware interface (e.g., BIOS or UEFI) updates, read values from registers indicative of configuration or state, and the like. Other examples of activities include booting a device that is been turned off, remote installation of operating systems, updates, setting hardware clock speeds, updating or querying firmware versions, and the like.

SUMMARY

The following is a non-exhaustive listing of some aspects of the present techniques. These and other aspects are described in the following disclosure.

Some aspects include a process including: receiving, with a rack-controller, via a first network, an application program interface (API) request, wherein: the rack-controller is configured to control a plurality of rack-mounted computing devices mounted in a plurality of different rack units of one or more racks; the rack-controller is configured to control the rack-mounted computing devices via a second network, different from the first network; the rack-controller includes a gateway between the first network and the second network; the second network is an out-of-band network distinct from an in-band network with which data is conveyed between rack-mounted computing devices or between rack-mounted computing devices and the internet; and the API request is encoded in a first protocol; based on the API request, selecting, with the rack-controller, one of a plurality of routines to effectuate control via the second network of at least some of the plurality of rack-mounted computing devices, the plurality of routines including: a first routine that reads a sensor via the second network on one of the rack-mounted computing devices; a second routine that reads a sensor via the second network on the rack but not on one of the rack-mounted computing devices; a third routine that scans computing devices on the second network and produces an inventory of the scanned computing devices on the second network; a fourth routine by which a configuration of an extensible firmware interface (EFI) of a given one of the rack-mounted computing device is adjusted; and executing, with the rack-controller, the selected routine and, as a result, sending one or more commands via the second network encoded in a second protocol different from the first protocol to effectuate an action indicated by the API request.

Some aspects include a tangible, non-transitory, machine-readable medium storing instructions that when executed by one or more processors effectuate the above process.

Some aspects include one or more processors and memory storing instructions that when executed by the processors effectuate the above process.

BRIEF DESCRIPTION OF THE DRAWINGS

The above-mentioned aspects and other aspects of the present techniques will be better understood when the present application is read in view of the following figures in which like numbers indicate similar or identical elements.

Figure 1:
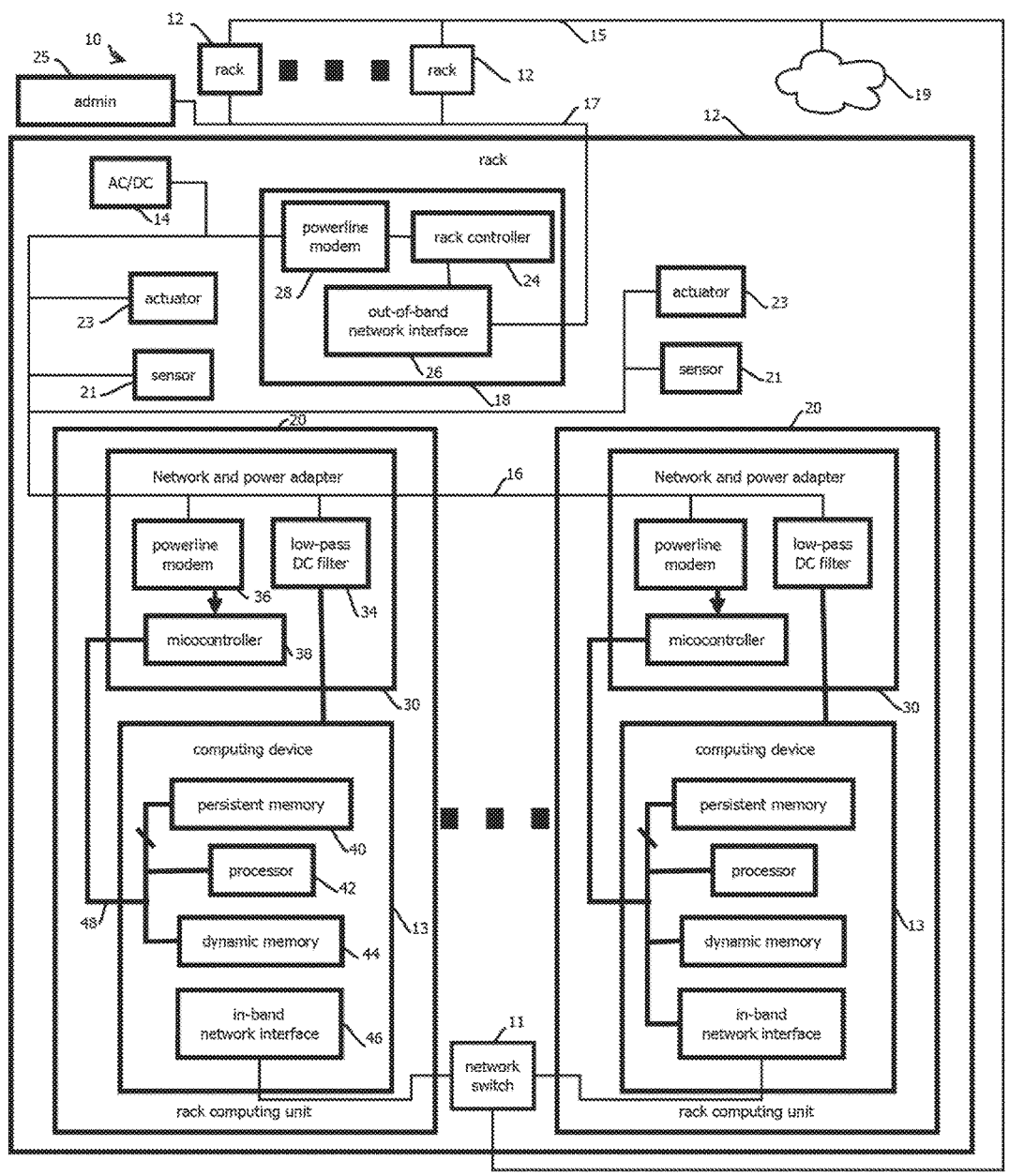
FIG. 1 is a physical-architecture block diagram that illustrates a data center configured for out-of-band management via power bus, in accordance with some embodiments.

While the invention is susceptible to various modifications and alternative forms, specific embodiments thereof are shown by way of example in the drawings and will herein be described in detail. The drawings may not be to scale. It should be understood, however, that the drawings and detailed description thereto are not intended to limit the invention to the particular form disclosed, but to the contrary, the intention is to cover all modifications, equivalents, and alternatives falling within the spirit and scope of the present invention as defined by the appended claims.

DETAILED DESCRIPTION OF CERTAIN EMBODIMENTS

To mitigate the problems described herein, the inventors had to both invent solutions and, in some cases just as importantly, recognize problems overlooked (or not yet foreseen) by others in the field of data center equipment design. Indeed, the inventors wish to emphasize the difficulty of recognizing those problems that are nascent and will become much more apparent in the future should trends in the data center industry continue as applicants expect. Further, because multiple problems are addressed, it should be understood that some embodiments are problem-specific, and not all embodiments address every problem with traditional systems described herein or provide every benefit described herein. That said, improvements that solve various permutations of these problems are described below.

This patent disclosure describes several groups of inventions that can be, but need not necessarily be, used together. The groups are described in a sequence that generally follows their relative proximity to the edge of an out-of-band network or networks. A first group of inventions described with reference to FIGS. 1-4 and FIG. 5 relates to a system and process by which an out-of-band network may be implemented between a rack-mounted computing device and a rack controllers or other data center management computing devices. A second group of inventions described with reference to FIGS. 1-4 and FIG. 6 relates to systems and processes for managing groups of rack-mounted computing devices with rack controllers and other data center management computing devices. A third group of inventions described with reference to FIGS. 1-4 and FIGS. 7 and 8 relates to systems and processes for managing groups of rack controllers and other data center management computing devices. Additional inventions described take the form of combinations of these groups.

Many extant out-of-band management products have deficiencies. Among these problems, the application program interface (API) capabilities of these products are lacking. Additionally, many existing out-of-band management products rely on a wired, Ethernet-based communications bus and some variation of a baseboard management controller (BMC) per server. As a result, many of these systems suffer from reliance on an API that is difficult to implement, sensorfication that is typically limited to chassis-only (e.g., on the chassis of the rack-mounted computing device, rather than on the rack itself or related infrastructure), and reliance on wired connections and a BMC, which may have a more limited set of exposed functionality than some embodiments.

Additionally, many data center management products also lack the ability to sufficiently aggregate and analyze data across a multitude of services, including application, operating system, network, building management system, hardware, power, fire, and other capabilities. The ability to look "north" and "south" of the rack is an open issue in the data center market. Typically, significant hardware investment has been necessary to achieve modest monitoring and control capabilities; the ability to provide northbound and southbound management and analytics capabilities in a variety of form factors (controller, switch module, etc.) has been hard to achieve.

Generally, there is a need for a turn-key, easy-to-operate set of management, sensorfication and intelligence services that are well-integrated with hardware like that described herein and used in data centers. This includes supported power, fire, network, and other ancillary equipment, in some embodiments. (This is not to suggest that some embodiments do not also suffer from different subsets of the above-described issues, as the various inventions described herein may be used to beneficial effect without implementing other inventions addressing other problems. Thus, not all embodiments mitigate all described problems, and some embodiments mitigate problems implicitly described that will be apparent to one of ordinary skill in the art.)

In some embodiments, a Data Center Sensorfication, Control, Analytics and Management Platform, referred to as "Vapor CORE," mitigates some or all of the problems above by providing a set of services with south-of-rack (south-bound') management and monitoring capabilities, as well as north-of-rack (northbound') aggregation and analytics capabilities. In some embodiments, these capabilities are exposed in a 'southbound' API and 'northbound' API, and are supported by a variety of tools and deployment options that can be used to integrate, analyze, visualize and operationalize the data and decisions generated by the APIs and components. In some embodiments, Vapor CORE's API may be exposed by rack control units or other data center management computing devices, like those described below and that execute logic to implement the APIs.

In some embodiments, Vapor CORE is implemented as a set of microservices (e.g., each executing a server monitoring a respective port on a respective computing device and executing code responsive to communications received via that port (either loopback or external) and sending output via that port), executing on the rack controller described below, and deployed and managed automatically by the techniques described below or those the Crate Configuration, Container and File management system described in U.S. Patent Application 62/275,909, filed 7 Jan. 2016, titled RACK FOR COMPUTING EQUIPMENT, the contents of which are incorporated by reference above. The services may be organized in two categories: a southbound API and a northbound API.

The southbound API of Vapor CORE, in some embodiments, provides a RESTful (representational state transfer) API built atop Nginx™ and uWSGI™, using Flask™ as the microdevelopment framework. A Python™ package, in some embodiments, is used to interpret API requests and translate them into a serial protocol payload, sent over power line communications (PLC) to devices along the serial bus. Response data, in some embodiments, is read from the serial bus, interpreted, and returned to the API consumer in JSON format. The API capabilities, and corresponding implementing code, in some embodiments, include:

Ability to scan or enumerate the devices to gather a full picture of devices and capabilities available; the results of the scan, in some embodiments, are returned in an easy-to-interpret form that allows for easy programmatic access. These results, in some embodiments, also include locational information for sensors and devices, for easy mapping and visualization of every piece of data gathered from the system, as discussed in U.S. patent application Ser. No. 15/337,732, filed on 28 Oct. 2016, titled SENSING LOCATION OF RACK COMPONENTS, the contents of which are hereby incorporated by reference, and elsewhere in this document with reference to location-awareness-related sensing.

Reading of analog and digital sensors. This, in some embodiments, involves translating a stream of bytes into a meaningful and human-understandable response. Sensor support, in some embodiments, includes humidity, temperature, pressure, vibration, particulate, noise, and other similar sensors.

LED (light emitting diode) control for rack (e.g., wedge) status communication. The LED light at the top of a rack, in some embodiments, may be changed in terms of color, illumination, or blinking to visually communicate rack status. Or audible or other visual indicators may be actuated.

Fan control, including, in some embodiments, getting fan status in terms of revolutions-per-minute (RPM).

Power control and status. This involves, in some embodiments, sending a command to a device, requesting power on/off/cycle or status. In some cases, power status is returned and translated from the power supply's format to a more easily machine- or human-interpretable form. This, in some embodiments, includes power status (on/off), power "ok" (true/false), voltage and current consumption, and whether the power supply registers an undervoltage or overcurrent condition.

Device inventory, including subcomponent inventory from servers and devices in the rack. The response, in some embodiments, may also include Extensible Firmware Interface (EFI) (like Basic Input/Output System (BIOS) or Unified Extensible Firmware Interface (UEFI)) information, which may include items such as Asset Tag and other device-specific information.

Boot device selection, allowing, in some embodiments, boot device to be retrieved from device, as well as for the boot target to be specified. This, in some embodiments, may be used for automated provisioning of data center devices.

Door lock control. Door locks, in some embodiments, may be controlled on a rack's front door to allow/deny physical access to rack contents, as well as to provide an audit trail of physical access to a given rack. Or some embodiments may implement U-specific locks that gate access to individual rack-mounted computing devices.

Intelligent Platform Management Bus (IPMB) Communications Protocol. Some embodiments allow sending/receiving of IPMB packets over serial bus to carry out standard IPMI commands over IPMB via a powerline communication (PLC) bus.

OCP (Open Compute Project™) debug header POST (power-on self-test) code retrieval.

Firmware flash. Some embodiments allow device firmware to be remotely updated through the API.

Version information about the endpoint, software, and API.

Additionally, in some embodiments, the southbound services provided by Vapor CORE include serial console access to individual devices in the rack. This access, in some embodiments, is provided over PLC as well, and is mapped to virtual TTY devices, that may be accessed locally from the rack controller described below, or remotely via secure shell (SSH) to a Transmission Control Protocol (TCP) port on the rack controller described below. This, in some embodiments, is implemented by mapping a TTY to a device ID, and communicating with rack controller described below to marshal access to the serial console of that device.

The services described above, in some embodiments, are distributed via a Docker™ container, managed by Crate (described below with reference to FIGS. 1-4 and 7-8). Serial console access, in some embodiments, is managed by a separate operating system module that scans the bus and creates and maps the devices based on its interpretation of the scan command.

In some cases, the southbound API may facilitate the process of obtaining data from sensors on rack-mounted devices, like servers. Often, sensors impose a large number of steps to convert sensor readings to things useful to machines or humans, e.g., converting a voltage from a thermocouple to a temperature. To mitigate this issue, some embodiments may identify what type of sensor is present based on a code returned that indicates the sensor type, which may be obtained based on electrical characteristics and reading registers, for instance, using techniques described below or in U.S. Patent Application 62/275,909, in a section titled "External Access to Local Motherboard Monitoring and Control." In some embodiments, based on the code, the appropriate conversion may be selected, e.g., volts to degrees Celsius. Some embodiments may use this technique to obtain temperature, humidity, particulate count, air flow rates, etc., as opposed to a voltage or a current or other scaled value.

The northbound side of Vapor CORE, in some embodiments, is a separate microservice that is designed in a three-level pluggable architecture including the following:

Data source plugins

Analytics engine

Presentation plugins

Data source plugins, in some embodiments, may be registered with Vapor CORE given a standard data source data transformation API and may be used to gather data from a variety of sources in the data center, including, in some embodiments, the southbound API, Crate, building management systems, fire suppression and power distribution systems, Bloom box API™, other management and control systems (e.g., Puppet™, Chef™, Ansible™, etc.), IPMI/iLO/DRAC, etc. Registration of components, in some embodiments, includes storage of addressing, credentials and rules for polling, among other things; registration data piggybacks the data store in the analytics layer, and may be carried out via API or user interface (UI) (both distributed with Vapor CORE).

In some embodiments, an analytics engine component serves as a primary data store for Vapor CORE and stores plugin registration, as well as schematized data gathered by plugins. Pre-built analytics routines, in some embodiments, may be included with Vapor CORE to compute metrics such as price per watt per dollar (price/W/$), cost of cloud, etc. Additional analytics routines, in some embodiments, may be developed by customers or solution vendors, and snapped into the analytics engine, bound to the data source plugins registered with Vapor CORE.

Presentation plugins (e.g., executing on a data center management computing device, like those described below, for instance in a dashboard application), in some embodiments, may be registered with Vapor CORE given a standard presentation plugin API and may be used to export the result of analytics routines in a variety of forms (e.g. UI, comma separated values (CSV), JavaScript™ Object Notation (JSON), extensible markup language (XML), etc.). Presentation plugins, in some embodiments, are bound to a set of analytics routines and data sources stored in the analytics engine, and transform and present the data in a variety of ways. Presentation plugins, in some embodiments, are registered in a similar manner to data source plugins, and their registration also includes configuration of the output mechanism (e.g. TCP port, file, etc.).

In some embodiments, Vapor CORE sits atop a variety of data sources and provides an endpoint exposing raw, aggregate and computed data points that may be consumed by a higher level tool, such as an orchestration or automation engine, dashboard, or as a data source input to another Vapor CORE instance. Crate and Vapor CORE, in some embodiments, may also communicate reciprocally to inform and perform automated management tasks related to data center equipment or Vapor components such as Vapor Edge Controllers (VECs) and Vapor software.

Vapor CORE, in some embodiments, may exist in a hosted environment, and be used to remotely monitor and manage a data center, as described elsewhere herein with reference to Crate.

In some embodiments, Vapor CORE may perform or provide critical (which is not to imply that it, or any other feature, is required in all embodiments) environment live migration, data center management or devops capabilities, workload and management capabilities and the like.

In some embodiments, the distributed nature of Vapor CORE and the data center racks may allow for strategies for data aggregation and analysis in a decentralized manner. This is expected to allow for the computing resources of the rack controllers to be well-utilized and facilitate operations at scale.

Some embodiments may be configured to obtain a device inventory and boot selection from rack-mounted devices. For instance, upon scanning (e.g., an inventory scan for a particular device), some embodiments may access a system management bus (SMBUS) on the server midplane and retrieve a list of processors and device list seen by the operating system of the server. In some cases, this data may be acquired from SMBUS without using an agent executing within the operating system or on the CPU of the server. Similarly, some embodiments may access this bus to interrogate and change boot target selection or adjust BIOS (or other EFI) settings in memory, e.g., for automated provisioning that includes switching to a different boot target on the network to roll out a new BIOS. In some embodiments, the boot target can be read and set by the southbound API, e.g., with a representational state transfer (REST)-based request. Further, some embodiments may perform agentless system monitoring of the operation of the rack-mounted device, e.g., tracking a server's CPU usage rate and memory consumption, in some cases, without using a BMC. Further, some embodiments may provide for remote console access—remote TTY—over powerline communication. In some cases, because communication occurs via a web proxy, web-based security techniques may be employed, like OAuth and Lightweight Directory Access Protocol (LDAP).

In example use cases of some embodiments, these techniques may be used to view diagnostic information describing a boot operation. For instance, if a machine is power cycled, some embodiments may retrieve power-on self-test (POST) codes for troubleshooting. These techniques are best understood in view of an example computing environment.

In some cases, the features of Vapor Crate are provided by some of the embodiments described below with reference to FIGS. 1-5 and 7-8, the features of Vapor CORE are provided by some embodiments described below with reference to FIGS. 1-4 and 6.

FIG. 1 illustrates a data center 10 configured to mitigate a variety of problems, both those explicitly discussed below, and those implicit in the description and which will be apparent to those of ordinary skill in the art. In some embodiments, the data center 10 includes a plurality of racks 12 (e.g., identical racks arranged in a pattern, like a rectangular array or hexagonal packing pattern), examples of which are described in each of the applications incorporated by reference, such as those titled RACK FOR COMPUTING EQUIPMENT. These applications describe, in certain embodiments, wedge-shaped racks arranged to form chambers, and those wedges may serve as the racks herein. Or the racks may take other forms, e.g., traditional racks, e.g., those with hot aisles, arranged edge-to-edge along linear aisles, either with front-access or rear-access for maintenance.

The racks may house (e.g., mechanically support, cool, and provide data and power to) a plurality of rack-mounted computing devices 13, an example of which is described below with reference to FIG. 9. In some embodiments, the data center 10 includes a relatively large number of racks 12, for example, more than 10, or more than 20, and each rack may house a relatively large number of computing devices 20, for example, more than 10, and in many cases, more than 50. In some cases, the rack-mounted computing devices 13 are arranged in discrete units of space, called "U's," for instance in a vertical stack of U's. In some cases, the rack-mounted computing devices are mounted to rails (e.g., on a slideable shelf) and can be slid horizontally outward from the rack for service. Or in some cases, the racks have U's arrayed horizontally, and rack-mounted computing devices 13 may be slid vertically, upward, like out of a bath of cooling liquid, such as mineral oil. In some cases, a cooling fluid (e.g., liquid or gas) is conducted over the rack-mounted computing devices 13 for cooling. Three racks 12 are shown, but embodiments are consistent with a single rack or substantially more racks. Each rack 12 may include the features illustrated in the enlarged view of one of the racks 12. Data centers provide and use computational resources (e.g., applications, networks, computing devices, virtual machines, containers, and the like) in two domains: (i) to provide general purpose computing power (or special purpose computing power) to a user; and (ii) to manage the data center itself. Accordingly, it is helpful to define terminology to distinguish between these domains, as commercial implementations often use different types of resources in each domain, typically with much less expensive and much less powerful resources being used for management. These different domains are distinguished herein by more broadly leveraging the "in-band" and "out-of-band" modifiers used in industry to identify networks serving these respective domains. Thus, the rack-mounted computing devices 13 may execute "in-band" applications that provide the functionality for which a data center or rack therein is built, e.g., hosting user-facing software-as-a-service applications or virtual machines, storage, or containers provided as service to remote users or applications. This is distinct from "out-of-band" resources (applications, computing devices, and networks) used to manage the rack-mounted computing devices 13, as part of the infrastructure of a rack or (i.e., and/or) data center. In some embodiments, the out-of-band networks have less than ½ the bandwidth of the in-band network, e.g., less than ¹⁄₁₀th. In some embodiments, the out-of-band computing devices (or corresponding constructs, like virtual machines) have less than ½ the available floating-point-operations-per-second than the in-band computing devices, e.g., less than 1/10th. Some embodiments may keep these out-of-band infrastructure resources and in-band applications separate, either partially (e.g., with different containers or virtual machines) or fully (e.g., with different computing devices), for security purposes.

To this end and others, some embodiments may include an in-band-network 15 (e.g., implemented with network switches 11, like top-of-rack switches) and an out-of-band network 17, each having a distinct address space (e.g., a private Internet-Protocol (IP) subnet or different ranges of public IP addresses), with the former 15 conveying data between rack-mounted computing devices 13 or the public Internet 19, and the latter 17 conveying data within the data center 10 (and in some cases, externally) for purposes of managing the rack-mounted computing devices 13 (e.g., monitoring, provisioning, load-balancing, updating, servicing, etc.) and related infrastructure (e.g., monitoring, responding to, and adjusting cooling or power delivery). Keeping the networks 15 and 17 (and related computing devices or applications) separate is expected to reduce the likelihood of a penetration of the more externally facing in-band-network 15 resulting in an attacker gaining control of data center infrastructure. That said, embodiments are also consistent with consolidating these networks or different subsets of the out-of-band resources (e.g., computing devices or applications).

Many traditional out-of-band networks present a number of problems in data center designs. For instance, often switching and wiring is replicated relative to the in-band-network all the way to the edge of the out-of-band networks, often doubling the networking equipment costs and wiring complexity in a data center (which should not be read as a disclaimer, as some embodiments of some inventions described herein are consistent with this approach).

These problems often co-occur with other undesirable aspects of data center hardware. Additional issues include added cost for power distribution and conditioning circuitry. In many cases, power is distributed within a data center via alternating current, while individual computing devices generally operate on direct current. In many cases, the transition between alternating current and direct current is made with computing-device specific AC-to-DC power converters. This architecture has the undesirable effect of multiplying the number of power converters within a data center, placing a heat source and electromagnetic radiation source near sensitive computing equipment, occupying valuable rack space, and multiplying the number of locations were failures may occur in hardware. (These discussions of problems with traditional design should not be taken as disclaimers of subject matter, as several inventions are described, and they are independently useful and may be used in environments where some problems persist while others are addressed.)

To mitigate these issues, in some embodiments, an edge-portion of the out-of-band network may be replaced or supplemented with a plurality of powerline communication networks that deliver both data and direct-current power to a plurality of rack-mounted computing devices. In some cases, each rack 12 may include a (e.g., one and only one, or more than one) rack-specific powerline network, which may be a DC-powerline network 16. Or in some cases, an individual rack 12 may include a plurality of powerline networks, or a powerline network may span multiple racks 12. Or in some cases, a rack 12 may have separate power-delivery and sub-networks (relative to the out-of-band network 15 extending throughout a data center).

Thus, some embodiments may include 1) an in-band-network 15; 2) a data center-wide out-of-band network 17; and 3) a plurality of sub-out-of-band networks 16. Each sub-out-of-band network may have their own address space distinct from each other and the data center-wide out-of-band network and in-band network 15 (e.g., each using the same addresses for different devices on different racks), and each sub-out-of-band network may provide out-of-band network access for monitoring and controlling a plurality of rack-mounted computing devices 13 (e.g., a full-rack) and sensors and other actuators associated with the plurality of rack compute units 20 (e.g., associated with the rack).

To these ends and others, an alternating-current-to-direct-current converter 14 may deliver direct current to each of the racks 12 via a bus 16 that also conveys data. In some embodiments, each rack 12 may include its own dedicated converter 14 that services a collection of computing devices on the rack, or in some cases several racks 12 may share a converter 14. In some embodiments, converter 14 includes a rectifier, step down transformer, and low-pass filter operative to deliver, for example, to racks 12, direct current power. Rack-specific converters are expected to segment the media for out-of-band data signaling, reduce the number of users of the address space on the media, and permit simplified and less expensive circuitry for the devices communicating on the DC power bus, but embodiments are also consistent with busses shared across racks. Having consolidated AC-to-DC converters for a collection of computing devices (e.g., a full rack) is expected to avoid the cost and thermal load arising from performing the conversion at each computing device with a dedicated converter, though embodiments are also consistent with this implementation. Some embodiments may have one AC-to-DC converters per plurality of rack-mounted computing devices 13, e.g., one per rack, or one per collection of racks. In some cases, data may be conveyed via an AC powerline network.

In some embodiments, direct-current power is distributed throughout a rack 12 via a direct current power bus 16. In some cases, the direct-current power bus 16 includes two distinct conductors, for example, carrying ground and a 12-volt or 48-volt potential with two and only two conductors along a terminal portion of a path to a device receiving power and data at an edge of the sub-out-of-band network formed by bus 16. In some embodiments, each rack 12 may include the DC bus 16, or a dedicated DC bus 16 specific to that rack, for example, to maintain and address space within a rack that is distinct from that of other racks and simplify signaling protocols (e.g., by reducing the number of devices contending for a given instance of the network medium) and reduce cost of associated circuitry.

In the illustrated embodiment, racks 12 each include a rack control unit 18, a plurality of rack-mounted computing devices 13, a plurality of sensors 21, and a plurality of actuators 23. The racks 12 may have a plurality of rack computing units 20, e.g., each being one U and having one or more of the rack-mounted computing device 13 along with device-specific support hardware, like the adapters 30 described below. Two units 20 are illustrated, but embodiments are consistent with substantially more, for example, on the order of 8 or more per rack. Some embodiments may have multiple rack-mounted computing devices 13 per unit 20, or multiple units 20 per device 13.

In some embodiments, the rack control unit 18 is a type of data center management computing device and, thus, may exercise local control and monitoring (e.g., without directly monitoring or controlling devices in other racks—though embodiments are also consistent with this) over the operation of devices 20, 21, and 23 in the rack 12 (and perform operations distinct from a network switch that routes in-band data), and each rack 12 may include its own independent rack control unit 18. In other cases, the data center management computing device may be rack-mounted computing device executing a rack controller that exercise local control and monitoring (which is not to imply that monitoring is not an aspect of or form of control).

In some embodiments, the rack control units 18 may operate as gateways between an Ethernet out-of-band network 17 and a DC power bus networks 16, for example, specific to each rack 12. In some embodiments, the out of band Ethernet network 17 may connect each of the racks 12 via their rack control unit 18, and the data center may be managed via networks 16 and 17, with monitoring data being sent back to a data center management computing device 25 via networks 16 and 17 and commands being distributed via network 17 for implementation by controllers 18 and networks 16.

Sensors 21 may be any of a variety of different types of sensors, like those described below as being associated with rack computing units 20. Examples include temperature, particulate, vibration, humidity, optical, and other sensors. In some cases, the sensors 21 are secured to the rack 12 itself, rather than a computing unit 20 or device 13 (e.g., the device 13 can be removed and the sensor 21 would remain on the rack, and the sensor 21 may be on the rack before any devices 13 are installed). In some cases, the sensors 21 are not specific to an individual computing unit 20 or device 13. Or some embodiments may include, as part of the rack 12, one or more sensors for each U in the rack 12, e.g., a location sensor like those described in U.S. patent application Ser. No. 15/337,732, filed 28 Oct. 2016, titled SENSING LOCATION OF RACK COMPONENTS, the contents of which are incorporated by reference.

In some cases, the sensors 20 sense an attribute of the rack and its environment and send signals indicative of measurements via network 16 to controller 24. In some cases, some sensors 20 are based on microcontrollers rather than full computers (having an operating system executed on a microprocessor) to sense and report values without incurring the cost and thermal load associated with a full computer (though embodiments are also consistent with this approach).

Actuators 23 may have features similar to the sensors 21 in the sense that some are microcontroller-based, some are distinct from units 20 and devices 13, and some draw power from the network 16 for similar reasons. In some cases, the actuators 23 are controlled by the rack control unit 18, e.g., reporting via network 16 a physical state of the sensor, receiving a command to change that state via network 16, and effecting the change with power from the network 16. A variety of different types of actuators may be included. Examples include a fire-suppression actuator operative to release a fire-suppression chemical (e.g., a gas or foam). Other examples include an actuator operative to adjust cooling fluid flow (e.g., a solenoid configured to cause rotation or translation of components of the spatially modulated airflow restrictors described in U.S. patent application Ser. No. 15/065,201, filed 9 Mar. 2016, titled COOLING SYSTEM FOR DATA CENTER RACK, the contents of which are hereby incorporated by reference) in a selected part or all of a rack (like responsive to a fire being detected to remove airflow or responsive to a temperature sensor in a rack indicating higher-local temperatures). For instance, some embodiments may detect a higher temperature in an upper part of one rack with a sensor 21 than a lower part, and with controller 18, instruct an actuator 23 to adjust a vent to afford greater airflow in the upper part or restrict airflow in the lower part (or other fluids). In another example, some embodiments may include a locking actuator, e.g., a pin driven by a solenoid biased open or closed by a spring into an aperture in an otherwise moveable component, and the lock may lock a given computing unit 20 shelf in place or a rack door closed, thereby providing physical security. In some cases, a sensor on the face of a rack may include a near-field-communication (NFC) sensor by which a technician's NFC card (or mobile device) is scanned to authenticate access, thereby limiting physical access to those authorized and providing an audit trail for who accessed what when.

In some cases, the sensors 21 and actuators 23 may be powered by and communicate with the network 16. Having distributed DC power and network communication available is expected to facilitate the use of denser and more widely distributed networks of sensors and actuators than is feasible in traditional designs in which each sensor would need its own AC-to-DC power source and an Ethernet network interface, adding cost and thermal load (though not all embodiments afford this benefit, which is not to imply that other features may not also be varied). In some cases, sensors 21 and actuators 23 may be operative without regard to whether a rack computing unit 20 is present or on, thereby providing sensing and control that is robust to crashes or lower-density deployments.

In some embodiments, remote terminal sessions, for example, may be maintained between the administrator's computer 25 connected to network 17 and individual rack computing units 20 via networks 17 and 16. In some embodiments, rack control units 18 may monitor the operation and presence of rack computing units 20 and, in some cases, components of those rack computing units 20, via the powerline communication bus 16. In some embodiments, the rack control unit 18 may be configured to periodically poll existing devices on the network 16 and report back via network 17 the result of the poll to device 25. In some cases, rack control units 18 may periodically request, from each rack computing unit 20 via the DC power bus 16, the status of various sensors, such as temperature sensors, vibration sensors, particulate sensors, fan speed sensors, airflow sensors, humidity sensors, air pressure sensors, noise sensors, and the like. In some embodiments, rack control unit 18 may compare the reported values to a threshold and raise or log various alarms, for example, via network 17, to bring a condition to the attention of an administrator. Similarly, in some cases, rack control unit 18 may implement various changes on rack computing units 20 by a command sent via network 16. Examples include instructing rack computing units to boot up or turn off, update an EFI, change a setting in persistent flash memory (in some cases bypassing the EFI), update or report a firmware version, change a register value in a peripheral, and initiating and executing a remote terminal session. In some embodiments, rack control unit 18 and network 16 are operative to exercise control over the rack computing units 20 even when the computing devices, such as servers of those rack computing units, are turned off. This is expected to reduce the burden on maintenance personnel, as certain operations can be performed remotely, even in scenarios in which the computing devices are turned off.

In some embodiments, rack computing units 20 each occupy a respective shelf or a receptacle, such as a "U," in the rack. In some embodiments, each rack computing unit includes a distinct computer, having a dedicated processor and memory that operates to execute an operating system and application within a distinct memory address space. Any of a variety of applications may be executed, including web servers, databases, simulations, and the like, in some cases in virtualized computing devices or containers. In some cases, the rack-mounted computing devices 13 in each unit 20 are general purpose computers, or some embodiments may include special purpose computers, such as graphical processing units, bitcoin mining application specific integrated circuits, or low-floating-point precision (e.g., less than 16 bit) ASICS for machine learning. In some embodiments, the applications may communicate with one another and remote users via the in-band network 15 that conveys the data the computing devices operates upon, which stands in contrast to the management data by which the computing devices are managed and monitored via the out-of-band network 17.

In the illustrated embodiment, rack control unit 18 includes a rack controller 24, and out-of-band network interface 26, and a powerline modem 28. In some embodiments, the rack controller 24 may implement the logical functions described above and below, for example, for monitoring the rack computing units 20 and sensors 21, controlling the rack computing units 20 and actuators 23, and translating between the networks 16 and 17. In some embodiments, the rack controller 24 may execute routines that control, engage, and disengage various thermal control units, such as fans or adjustable airflow restrictors, that maintain the temperature of the rack computing units 20, for example, responsive to temperature sensors on the units 20 indicating an imbalance in airflow or positive pressure in an exhaust region. In some embodiments, the rack controller 24 is an application executing on a distinct computing device having a processor, memory, and an operating system, and such as a computer serving as the rack control unit 18 without hosting in-band applications, e.g., one provided with the rack 12 before in-band computing devices are installed. In some embodiments, the rack controller 24 includes a REST-based web server interface operative to receive instructions and provide responses on the network 17 according to a RESTful API. In some cases, the REST-based API may face the out-of-band network 17, receiving API requests via this network from other rack control units 18 or the administrator computing device 25.

In some embodiments, the out-of-band network interface 26 is an Ethernet network interface having an associated driver executing in the operating system of the rack controller 24 and configured to move data between buffer memory of the network interface and system memory, e.g., with direct memory access, and provide interrupts indicative of such movements. In some cases, the out-of-band network interface 26 connects to an Ethernet cable, such as a CAT5 (category 5), or CAT6 (category 6) cable connecting to the other racks 12.

In some embodiments, the various devices on the DC power bus 16, including the rack control unit 18, include a powerline modem 28. In some embodiments, the powerline modem 28 is a direct current powerline modem operative to encode data on top of a direct current power source. (Signals readily separated from the DC power, e.g., at higher than a threshold frequency or less than a threshold root-mean-square deviation for the median, do not transform the DC power to AC power.) In some embodiments, the data is transmitted by applying an electrical stimulus to the electrical conductors conveying direct current power. The stimulus may take any of a number of different forms. Examples include selectively connecting a higher or lower voltage to the conductors, thereby pulling the voltage up or down in a manner that may be sensed by other powerline modems. Other examples include selectively connecting a current source or drain to the conductors of the DC power bus 16, thereby again imparting an electrical signal on top of the DC power that may be sensed by other computing devices. In some embodiments, an impedance may be selectively coupled to the DC power bus, thereby, for example, affecting fluctuations imposed on top of the DC power bus in a manner that may be sensed by other powerline modems.

In some embodiments, the electrical stimulus is a time varying electrical stimulus. Data may be encoded by varying the electrical stimulus a number of different ways. In some embodiments, the stimulus may simply be turned on and off according to a clock signal, like with a square wave, and data may be conveyed by determining during each clock cycle whether the stimulus is applied or not, indicating a zero or one. In other examples, the stimulus may be used to adjust an attribute of a wave, like a carrier wave, maintained on the DC power bus. For example, data may be encoded with pulse width modulation, by applying a square wave to the DC power bus and adjusting the time of a falling edge of the square wave according to whether a zero or one is being transmitted. Other examples may adjust a rising edge of the square wave or a duty cycle of the square wave or other waveforms. In some embodiments, multiple attributes may be adjusted, for example varying in amplitude of the wave, a duty cycle of the wave, and times for falling or rising edges of the wave to encode additional data in a more compact form.

In some embodiments, at the same time data is being conveyed on the DC power bus, DC power is also being conveyed. In some embodiments, the data signals may be configured such that they do not interfere with the delivery of DC power. For example, the time varying electrical stimulus may change the DC voltage or current by less than a threshold percentage of what is delivered, for example with a RMS value less than 10% of the median, such that filtering can readily remove the data signal from electrical power being delivered to computing devices that are often sensitive to variations in electrical power. In other embodiments, the speed with which the data is conveyed, or a carrier wave, may be at a frequency such that low-pass filters can readily distinguish between the DC power component and the data component.

In some embodiments, to facilitate separation of data from power, the data may be encoded with pulse width modulation, such that data-dependent effects are less likely to interfere with power delivery. For example, absent a carrier wave, a relatively long string of ones or zeros that are consecutive may cause power to fluctuate on the downstream side of a low-pass filter, resulting in low-frequency increases or decreases in voltage of the DC powerline that may penetrate a low-pass filter. In contrast, pulse width modulation maintains a relatively uniform average voltage after a low-pass filter is applied, as the frequency of the pulses that are modulated may be selected such that they are readily separated from the underlying DC power signal.

In some embodiments, access to the DC power bus as a medium for data transmission may be arbitrated with a variety of techniques. Examples include time division multiplexing, code division multiplexing, frequency division multiplexing, orthogonal frequency-division multiplexing, and the like. In some implementations, it is expected that the bandwidth requirements for the network 16 will be very low (e.g., less than 100 kilobits per second), and an encoding scheme may be selected to reduce the cost of the associated circuitry. For example, in some implementations, the speed and cost of Ethernet connections may be excessive relative to the requirements for signaling. In contrast, relatively low bandwidth time division multiplexing circuitry on a synchronous network is expected to cost substantially less while still providing adequate bandwidth. This is not to suggest that embodiments are inconsistent with higher bandwidth architectures. It should be noted that many in the industry have persistently failed to recognize this opportunity for cost reduction and circuitry simplification.

In some embodiments, each powerline modem 28 may select a duration of time over some cycle in which that powerline modem on the network 16 is permitted to transmit, e.g., in the event that the powerline modem does not detect that another device on the network currently has control of the media. In some embodiments, a device has control of the media if it has received a request on the network 16 and has not yet responded. In some embodiments, the network may be a synchronous network. In some embodiments, the duration of time dedicated for each powerline modem on the network 16 to transmit when the media is unclaimed may be selected based on a factory set value, like a media access (MAC) address, initially.

In some embodiments, an ad hoc mechanism may be used to deal with collisions, in which multiple devices have selected the same duration of time. In some embodiments, the powerline modem 28 may be operative to detect when another device is transmitting at the same time, and in response, select a different duration of time, for example, randomly (like pseudo-randomly or by seeding a linear shift register with less significant digits of a reading from a temperature sensor). For instance, powerline modem 28 may have reserved as its time to transmit between zero and 100 milliseconds (ms) after some timing signal, while a powerline modem of a first rack control unit may have reserved as its time to transmit 100 ms to 200 ms, and a different rack computing unit may have as its time to transmit 300 ms to 400 ms. Collisions occur when two devices select the same duration of time, and a randomized re-selection may alleviate the conflict without a central authority allocating time slots. Selecting transmission durations in an ad hoc fashion is expected to substantially lower the cost of maintenance and simplify installation, as devices can be installed on the network 16 without additional configuration, in some embodiments. That said, not all embodiments provide this benefit, as several inventions are described that are independently useful.

In some embodiments, the modem 28 may encode data and commands in a particular format, for example, in packets having headers with an address of the receiving and transmitting devices. In some embodiments, each powerline modem on the network 16 may receive signals and determine whether the signal includes a packet having a header designated for that device. In some embodiments, the packets may include error correction and detection, for example, with parity bits, Hamming codes, or other redundant lower entropy encoding.

A variety of techniques may be used to receive signals. For example, some embodiments may apply the signal on the DC power bus 16 to a low-pass filter and then compare the filtered signal to the signal on the DC power bus 16 to determine a differential signal having, for example, a higher frequency component conveying data. In some cases, the differential may be compared to a threshold to determine whether a zero or one is being transmitted. Or a pulse-width modulated signal may be compared to an unmodulated signal of the same underlying frequency, and changes in edge timing may produce a signal that, when compared to a threshold, indicates a zero or one.

In some embodiments, the signals may correspond to those traditionally used in RS232 connections to facilitate re-use of existing hardware and software. Examples include the Data Terminal Ready signal, indicating that data terminal equipment (DTE) is ready to receive, initiate, or continue a call; the Data Carrier Detect signal, indicating a data circuit-terminating equipment (DCE) is receiving a carrier from a remote DCE; Data Set Ready, indicating that DCE is ready to receive commands or data; Request to Send, indicating that a DTE requests the DCE prepare to transmit data; Request to Receive, indicating that a DTE is ready to receive data from a DCE; Transmitted Data, carrying data from the DTE to DCE; and Received Data, carrying data from the DCE to the DTE.

In some embodiments, communication may be via request and response, where once a request is sent by one device on the network 16, the recipient device has the exclusive right to transmit on the network 16 until a response is sent. Or some embodiments may use a master-slave architecture, where, for example, the powerline modem 28 of the rack control unit 18 arbitrates which device communicates on the network 16 and when. Request and response synchronous architectures, however, are expected to allow for relatively simple and inexpensive circuitry, which may be favorable in some implementations.

As illustrated, in some embodiments, each rack computing unit 20 may include a network and power adapter 30 and a rack-mounted computing device 13 (a term that is reserved herein for in-band computing devices (which may be hybrid devices that also execute out-of-band applications in some embodiments like those described with reference to FIGS. 3 and 4)). In some embodiments, the network and power adapter 30 may separate DC power and data from the DC power bus 16, provide the power to the rack-mounted computing device 13, and process the data to implement various routines locally with logic that is independent of the rack-mounted computing device 13 and operates even when the rack-mounted computing device 13 is turned off.

In the illustrated embodiment, the network and power adapter 30 includes a low-pass filter 34, a powerline modem 36, and a microcontroller 38. In some embodiments, these components 34, 36, and 38 may be mounted to a printed circuit board that is distinct from a motherboard of the rack-mounted computing device 13 and couples, for example, via a cable, to the motherboard of the device 13. In some embodiments, the low-pass filter 34 may be operative to receive the DC power from the DC power bus 16, having the data signals overlaid there on, and remove the data signals to transmit a smooth, high quality DC power source to the rack-mounted computing device 13. A variety of techniques may be used to implement the low-past DC filter 34. In some embodiments, an inductor may be placed in series between the bus 16 and the rack-mounted computing device 13 to provide a relatively large impedance therebetween and reduce the power required to drive data signals onto the bus 16 and protect associated driver circuitry. In other embodiments, the low-pass DC filter 34 may also include a resistor placed in series between the bus 16 in the rack-mounted computing device 13, with a capacitor placed between a ground and high voltage signal of the bus to, again, provide an impedance to reduce the power requirements to drive data signals, while smoothing fluctuations.

In some embodiments, the powerline modem 36 is substantially similar to the powerline modem 28 described above and may implement the same protocols. In some embodiments, each rack computing unit 20 contains similar or the same features.

In some embodiments, the microcontroller 38 is operative to receive signals from the powerline modem 36 and take responsive action. In some embodiments, the microcontroller 38 monitors addresses in headers on packets received via the powerline modem 36 and determines whether the address corresponds to the rack computing unit 20. In some embodiments, the address is stored in persistent flash memory of the microcontroller 38, for example, in flash memory set with a serial number or MAC address set at the factory. In some embodiments, upon initially detecting that the network and power adapter 30 is connected to a DC power bus 16, the microcontroller 38 may broadcast is address to the other devices, for example, to add the address to a list of addresses maintained by the rack control unit 18 as received via the powerline modem 28.

In some embodiments, the microcontroller 38 may receive commands from the rack control unit 18 and implement those commands, for example, by querying or otherwise polling various sensors, like those described above, to monitor things like resources being used by the rack computing unit 20 (e.g. processor usage or memory usage), or environmental conditions, like temperature, vibrations, airflow, particulates, humidity, electromagnetic radiation, and the like. In some embodiments, the microcontroller 38 may be operative to drive various signals into the rack-mounted computing device 13 that reconfigure the rack-mounted computing device 13, monitor the rack-mounted computing device 13, or control the rack-mounted computing device 13. Examples include sending signals onto a system management bus or other bus of the rack-mounted computing device 13 that cause the rack-mounted computing device 13 to turn on, turn off, change a setting accessible via a BIOS (in some cases without engaging the BIOS and writing directly to flash memory), reconfiguring various settings, like clock speed or register settings for peripheral devices. In some embodiments, the microcontroller 38 is operative to poll various sensors that indicate the location of the rack computing unit 20, for example, by reading a value with an optical sensor or a radio frequency sensor disposed on a rack that indicates the location of a rack computing unit 20 adjacent that device.

In some embodiments, the rack-mounted computing device 13 is a server (e.g., a computer executing a server application), database, or node in a compute cluster that performs operations requested by users of the data center 10. Examples include serving webpages, servicing queries, processing API requests, performing simulations, and the like. Such computing operations are distinct from those performed to manage and control the operation of computing devices, for example, by changing versions of operating systems, updating or reconfiguring a BIOS, reading sensors, controlling fans, monitoring thermals, and the like.

In the illustrated embodiment, each rack-mounted computing device 13 includes persistent memory 40, a processor 42, dynamic memory 44, and an in-band network interface 46. In some embodiments, these components may be accessed by the microcontroller 38 via a system management bus 48 or various other onboard buses. In some embodiments, the components 40, 42, 44, and 46 may reside on a single monolithic motherboard, connected via soldered connections and conductive traces in a printed circuit board. In some embodiments, the persistent memory 40 is flash memory having various values by which the rack-mounted computing device 13 is configured, for example, by changing settings in a BIOS. In some embodiments, the processor 42 is one or more central processing units or graphics processing units. In some embodiments, the dynamic memory 44 contains memory used by the operating system and applications, in some cases having an address space distinct from the computing devices of other rack computing units.

In some embodiments, the in-band network interface 46 is an Ethernet network interface operable to communicate on a distinct Ethernet network from the networks 16 and 17. Separating these networks is expected to make the data center 10 more robust to attacks and facilitate operations even when the in-band network is disabled. Further, in some cases, the in-band network may be substantially higher bandwidth and use more expensive equipment than the out-of-band management networks 17 and 16. In some embodiments, the network 15 connected to interface 46 may convey the data upon which the applications operate, for example, at the request of users of the data center 10.

Figure 2:
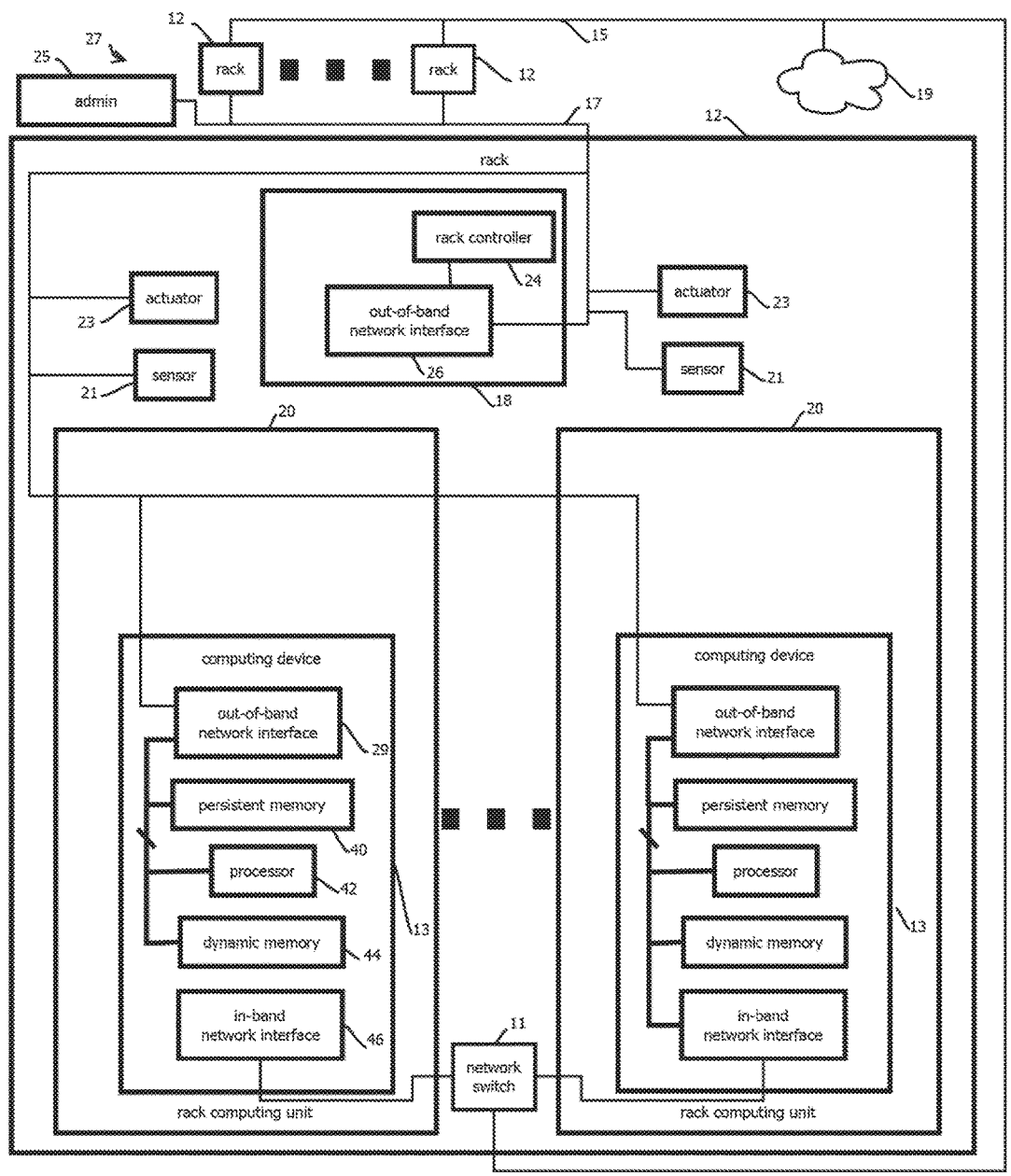
FIG. 2 is a physical-architecture block diagram that illustrates a data center configured for out-of-band management without using a power bus for communication, in accordance with some embodiments.

FIG. 2 another embodiment of a data center 27 having the features described above, except that the out-of-band network 17 extends to the rack-mounted computing devices 13. Thus, the rack controller 24 communicates with rack-mounted computing devices 13 directly, via the out-of-band network 17, rather than via the powerline communication network. In other embodiments, a separate Ethernet network specific to the rack is implemented in place of the power line network described above. In this example, the rack-mounted computing devices 13 may include an out-of-band network interface 29 with which the computing device 13 communicates with the rack controller 24. In some embodiments, each computing device 13 may include a baseboard management controller that communicates with the rack controller 24 via the out-of-and network interface 29. In some cases, an Intelligent Platform Management Interface (IPMI) API supported by the BMC may expose various functions by which the rack controller 24 takes inventory of devices on motherboards of the computing devices 13, read values from sensors (like temperature sensors), reads values of registers and configures and changes these values, in some cases, changing settings including EFI settings. In some embodiments, the BMC is a separate processor from processor 42 executing and in-band application, and the BMC communicates with various devices on the motherboard via the SMbus.

Figure 3:
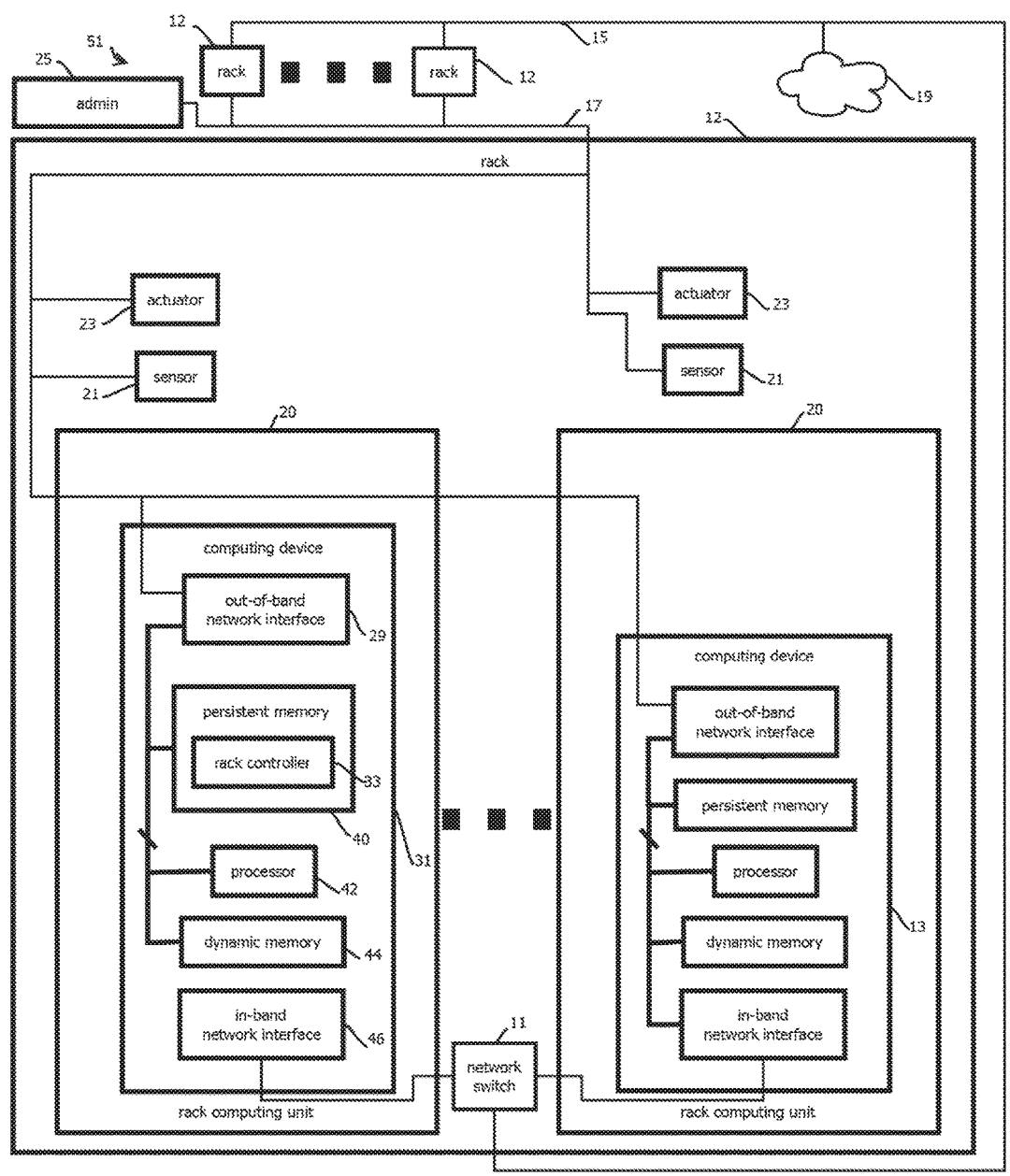
FIG. 3 is a physical-and-logical-architecture block diagram that illustrates a data center configured for out-of-band management without using a power bus for communication and with a rack controller executed by a managed device, in accordance with some embodiments.

FIG. 3 shows another embodiment of a data center 51 in which the above-described rack controller is executed by one of the rack-mounted computing devices 31 (which may otherwise have the features of device 13 described above). In some cases, software instructions to implement the rack controller 33 may be stored in memory 40 and executed by processor 42 of the rack-mounted computing device 31. In some cases, the rack controller 33 may be executed in a dedicated virtual machine, microkernel, or container of the rack-mounted computing device 31, with other instances of these computing constructs executing other applications, in some cases executing in-band applications. In some embodiments, one rack controller 33 may be executed by one (e.g., one and only one) rack-mounted computing device on a given rack to monitor other rack-mounted computing devices 13 on that rack 12. Or multiple instances per rack may be executed. Again, in this example, the out-of-band network 17 may extend to the rack-mounted computing devices 13 and 31, in some cases without passing through a power line communication network.

Figure 4:
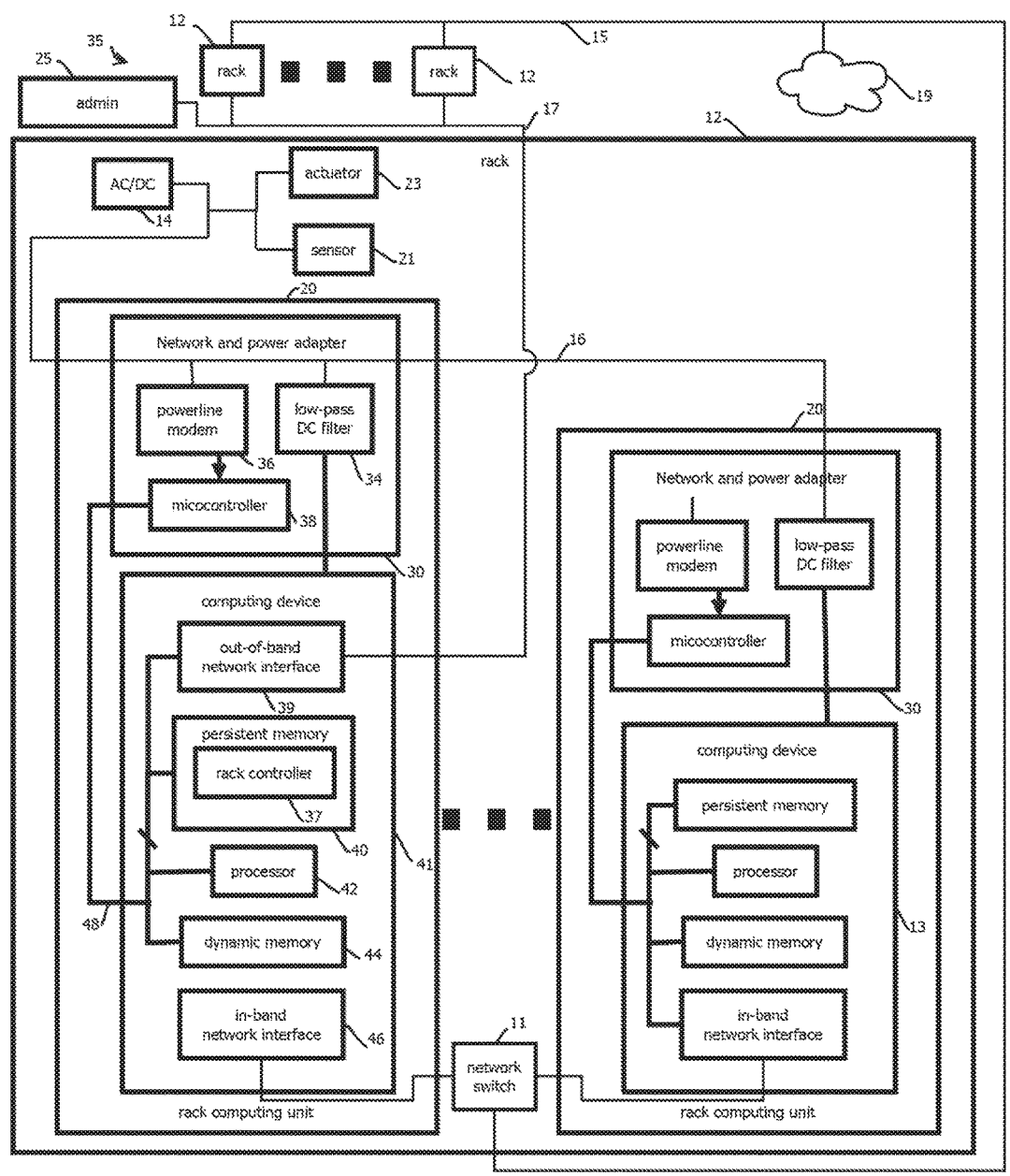
FIG. 4 is a physical-and-logical-architecture block diagram that illustrates a data center configured for out-of-band management via a power bus and with a rack controller executed by a managed device, in accordance with some embodiments.

FIG. 4 shows another embodiment of a data center 35 in which the present techniques may be implemented. In this example, the rack controller 37 (e.g., having the features of the rack controllers described above) may be executed by one of the rack-mounted computing devices 41 (otherwise having the features of device 13 above), by executing corresponding code in persistent memory 40 with a processor 42, in some cases within a dedicated virtual machine, container, or microkernel, e.g., in the arrangement described above for FIG. 3. In this example, the rack controller 37 may communicate with rack controllers on other racks 12 via the out-of-band network interface 39 of the rack-mounted computing device 41 via the out-of-band network 12. Further, the rack controller 37 executed by the rack-mounted computing device 41 may control other rack-mounted computing devices 13 of the rack 12 via the rack-specific power line communication network 16 and corresponding instances of the network and power adapter 30 described above.

Figure 5:
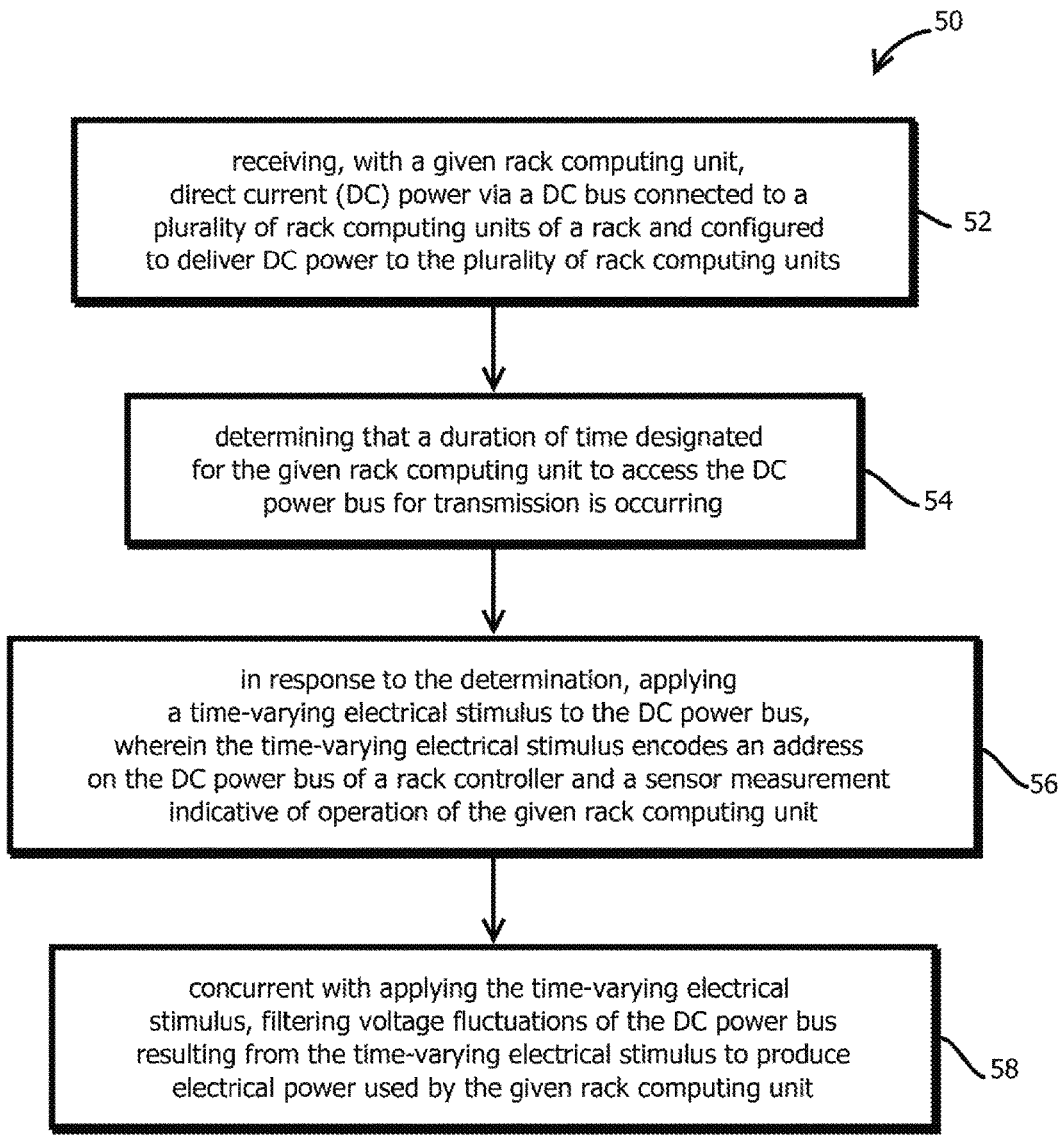
FIG. 5 is a flow chart that illustrates an example of a process for out-of-band management of a data center, in accordance with some embodiments.

FIG. 5 illustrates an example of a process 50 that may be performed by some embodiments of the above-described network and power adapter 30 in rack computing units 20. In some embodiments, steps for performing the process 50, or the other functionality described herein, are encoded as instructions on a tangible, non-transitory, machine-readable media, such that when the instructions are read and executed by one or more processors, the associated functionality occurs.

In some embodiments, the process 50 includes receiving, with a given rack computing unit, direct current power via a DC bus connected to a plurality of rack computing units of a rack and configured to deliver DC power to the plurality of rack computing units, as indicated by block 52.

In some embodiments, the process 50 further includes determining that a duration of time designated for the given rack computing unit to access the DC power bus for transmission is occurring, as indicated by block 54. Next, in response to the determination, some embodiments may apply a time-varying electrical stimulus to the DC power bus, as indicated by block 56. In some cases, the time-varying electrical stimulus encodes an address on the DC power bus of a rack controller and a sensor measurement indicative of operation of the given rack computing unit. In other cases, the stimulus may encode control signals rather than data signals. Next, concurrent with applying the time-varying electrical stimulus, some embodiments include filtering voltage fluctuations of the DC power bus resulting from the time-varying electrical stimulus to produce electric power used by the given rack computing unit, as indicated by block 58. Producing electrical power does not require that the power be generated, merely that power obtained from some source be conditioned properly for usage by the rack computing unit.

Figure 6:
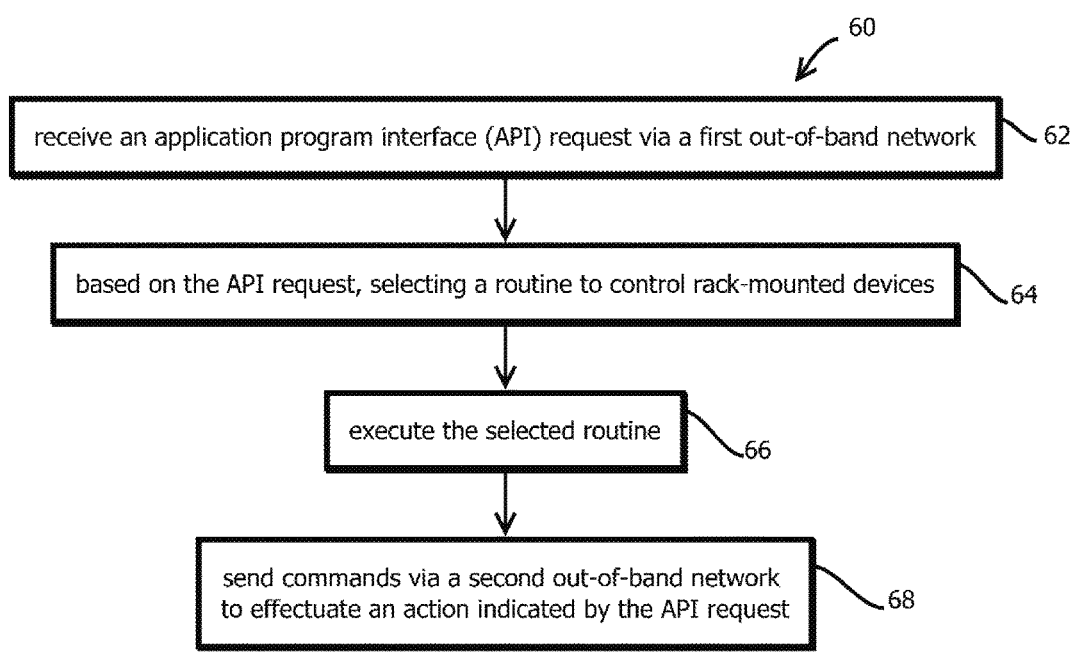
FIG. 6 is a flow chart that illustrates an example of a process to manage rack-mounted computing devices, in accordance with some embodiments.

FIG. 6 is a flowchart of an example of a process 60 that may be executed by one of the above-described rack controllers 24 (executed in various forms of data center management devices, e.g., rack control units 18 or rack-mounted computing devices 13 executing a rack controller 24) in order to monitor and otherwise control a subset of a data center (e.g. a rack) responsive to commands from other subsets of the data center or the above-described administrator computing device 25, e.g. being operated by an administrator. In some embodiments, the process 60 may implement the northbound and southbound APIs described above, for instance, with the northbound API facing the network 17 and the southbound API facing the network 16. In some embodiments, an instance of the process 60 may be executed by a different computing device associated with each rack 12 shown in FIGS. 1-4. In some embodiments, API requests may be sent from one rack controller 24 to another rack controller 24 or from the administrator computing device 25, for instance. In some embodiments, the process 60 may be executed ongoing, for instance, listening to a port on the out-of-band network interface 26 on the out-of-band network 17 and responding to API requests as they are received. In some embodiments, the process 60 may be part of an event processing loop in which API requests are handled, in some cases with a nonblocking server using deferreds.

In some embodiments, the process 60 includes receiving an API request via a first out-of-band network, as indicated by block 62. In some embodiments, this API request may be one of the above-described northbound API requests received by the rack controllers 18. In some embodiments, the API request is received via an Ethernet network that is distinct from the in-band network described above, or some embodiments may receive the API requests from the in-band network in cases in which the networks have been consolidated. In some embodiments, the API request is a REST-based request encoded in hypertext transport protocol (HTTP), for instance as a POST or GET request received by a server executed by the rack controller 24 described above. Some embodiments may parse received requests and take responsive action, for instance, via a common Gateway interface (CGI) routine. In some cases, requests may contain both commands and parameters of those commands, for instance, separated from the command with the delimiter like "?" and having key-value pairs. In some cases, these parameters may specify a particular device, such as a particular rack-mounted computing device on a rack, or in some cases, these parameters may specify various other attributes by which actions are taken. Using a REST-based API, with HTTP formatted exchanges, over an Ethernet-implemented IP network, is expected to facilitate reuse of other tools built for the data center ecosystem, thereby lowering costs and providing a relatively feature-rich implementation, though it should be noted that embodiments are not limited to systems providing these benefits or implementing these protocols, which is not to imply that any other feature is limiting in all embodiments.

Next, some embodiments may select, based on the API request, a routine to control rack-mounted computing devices, as indicated by block 64. Control may include reading data from such devices or associated sensors or actuators either on the rack-computing devices or on the rack itself, whether associated with a specific rack-mounted computing device or with the rack generally. Control may also include sending commands to write to, reconfigure, or otherwise actuate such devices, for instance, in accordance with the routines described herein, and including instructing computing devices to power cycle, updating firmware in rack-mounted computing devices or the various sensors or actuators, reconfiguring firmware or EFI settings, actuating fans, solenoids, electromagnets, lights, and the like. In some embodiments, the routine is selected based on text parsed from the API request, and in some embodiments, the routine is a script selected by a server that received the API request executed by a rack-controller 24. In some embodiments, selecting the routine includes calling the routine with parameters parsed from the API request as arguments in the function call.

In some embodiments, selecting a routine may include selecting a routine that takes action via a different network from the network with which the API request was received. In some cases, this different network may be a powerline communication network like those described above with reference to FIGS. 1, 4, and 5, but embodiments are consistent with other implementations, e.g., like those in FIGS. 2 and 3. For instance, in some cases, the other network is a network implemented with Ethernet, RS-232, USB, and the like. Or in some embodiments, the other network is the same, for instance, a branch of the network with which the API request is received. In some cases, this other network connects to each of a plurality of computing devices on the rack and various sensors and actuators associated with the rack, for instance, in accordance with the techniques described above with reference to network 16 in FIG. 1.

In some embodiments, selecting a routine includes selecting a routine that reads a sensor via the other network on one or more of the rack-mounted computing devices. In some cases, this may include sending a command to the above-described network and power adapters 30 that cause the above-described microcontroller 38 to query sensor data via an SMbus 48 (as shown in FIG. 1). In some cases, the sensor is on a motherboard or a chassis of the rack computing unit 20 described above, for instance sharing an output of the low-pass DC filter 34 described above with the rack-mounted computing unit 13 (as shown in FIG. 1).

In some embodiments, the routine selected is a routine that reads a sensor via the other network on the rack. In some embodiments, the sensor is not itself mounted to a rack control unit or powered by an output of a specific low-pass DC filter of a rack computing unit 20. For instance, some embodiments may read a value from a sensor on a rack that measures temperature, humidity, airflow, vibration, or particles, and open or close a lock state of a lock for a door or drawer, or the like. In some cases, the sensor is a sensor that reads and identifier indicative of the location of a given computing device in the rack, in accordance with the techniques described above.

In some embodiments, reading a value from a sensor may include processing that value before sending a response to the API request on the network 17 described above. Processing may take various forms, depending upon the embodiment and may include, in some cases, converting an electrical property, like resistance, capacitance, inductance, current, frequency, or voltage, to some other physical property correlated with the electrical property. For example, some embodiments may convert one or more of these values into units of temperature (like degrees Celsius or Fahrenheit), into units of humidity, into units of vibration (e.g. RPMs), into Boolean values indicating whether doors are open or closed locked or unlocked, and the like. In some cases, processing may include combining readings from multiple sensors or combining readings from a given sensor over time, for instance, selecting a largest or smallest value, calculating statistics on the sensor output like standard deviation or mean, and comparing sensor readings (such as these statistics) to various thresholds, for instance, to determine whether to respond with an alarm or emit an alarm even in the absence of a recent API request when a reading is above or below a threshold.

In some embodiments, the routines may be selected based on a scheduled API request (including an internal API request obtained via a loopback IP address) rather than a user-driven API request, for instance according to a cron process run by the rack controller to periodically read values from sensors and compare those values thresholds for monitoring purposes or logging those values and reporting those values to the data center management computing device 25. Or in some cases, these periodic requests may be received from a corresponding process that periodically automatically sends API requests from the administrator computing device 25 for monitoring purposes, for instance to update a dashboard. In either case, the request initiating action may still be an API request, such as one sent to a loopback address on a network interface coupled to the network 17 described above.

In some embodiments, the routine may be a routine that scans electronic devices on the second network and produces an inventory of the electronic devices on that network, such as computing devices, sensors, and actuators on the powerline communication network 16 described above or computing devices on an SMbus 48 described above.

In some embodiments, the routine may be a routine that changes a configuration of an EFI of a given one of the rack-mounted computing devices, for instance one that changes the same configuration on each of the rack-mounted computing devices. For example, some embodiments may change a boot target of the EFI, such that when the rack-mounted computing device is power cycled (or otherwise rebooted), the corresponding processor may look to a different media indicated by the new boot target when loading an operating system.

Some embodiments may send operating system updates to the rack controller, which may store those operating up system updates on an instance of this alternate media (such as a different disk drive, solid-state drive, or the like) on each of the rack-mounted computing devices before changing a boot target on each of those computing devices and commanding the computing devices to reboot to implement the new operating system with a reboot. In another example, some embodiments may update applications in this fashion, for instance by downloading an image of a new operating system or container with the new version of an application to alternate media and then changing the boot target to that alternate media. In some cases, these changes may be effectuated without interfacing with an operating system of the computing device 13 receiving the change. Similar techniques may be used to update firmware of peripheral devices.

Next, some embodiments may execute the selected routine, as indicated by block 66. In some embodiments, the routine may be executed by the rack controller described above. In some embodiments, this may include sending a sequence of commands via the second network, such as network 16 described above, and in some cases, these commands may be received by the network and power adapters 30, which may respond by executing their own routines with microcontroller 38 to effectuate various actions via the SMbus 48 or other interfaces. In other examples, the above-described sensors 21 or actuators 23 may receive the corresponding commands via the network 16 (which again, maybe a powerline communication network or other form of network), and the functionality described above may be implemented at the direction of a rack controller 24. In the course of executing the routine, some embodiments may send commands via a second out-of-band network to effectuate an action indicated by the API request, as indicated by block 68. For instance, the routine may include a query for values in registers of computing devices (or components thereof) or an inventory of such devices or components. Or the routine may include instructions to change a configuration of these devices, or read a sensor, or actuate an actuator. Other examples are described above. The routine may include operations that cause these commands to be sent and responses to be processed, consistent with the approaches described above.

In some embodiments, the rack controller 24 may perform agentless monitoring of the rack-mounted computing devices 13 via the networks 16 and 48 described above. For example, some embodiments may read various values indicative of the performance of the computing device, like temperature, processor utilization, fan speed, memory utilization, bandwidth utilization on the in-band network 15, packet loss on the in-band network 15, storage utilization, power utilization, and the like. In some cases, these values may be read from registers associated with the corresponding electronic devices without interfacing with an operating system of the corresponding rack-mounted computing device 13, in some cases via a BMC using the IPMI protocol. Or, in some cases, these values, and the other values read and actions taken, may be effectuated without using a BMC of the rack-mounted computing devices.

Figure 7:
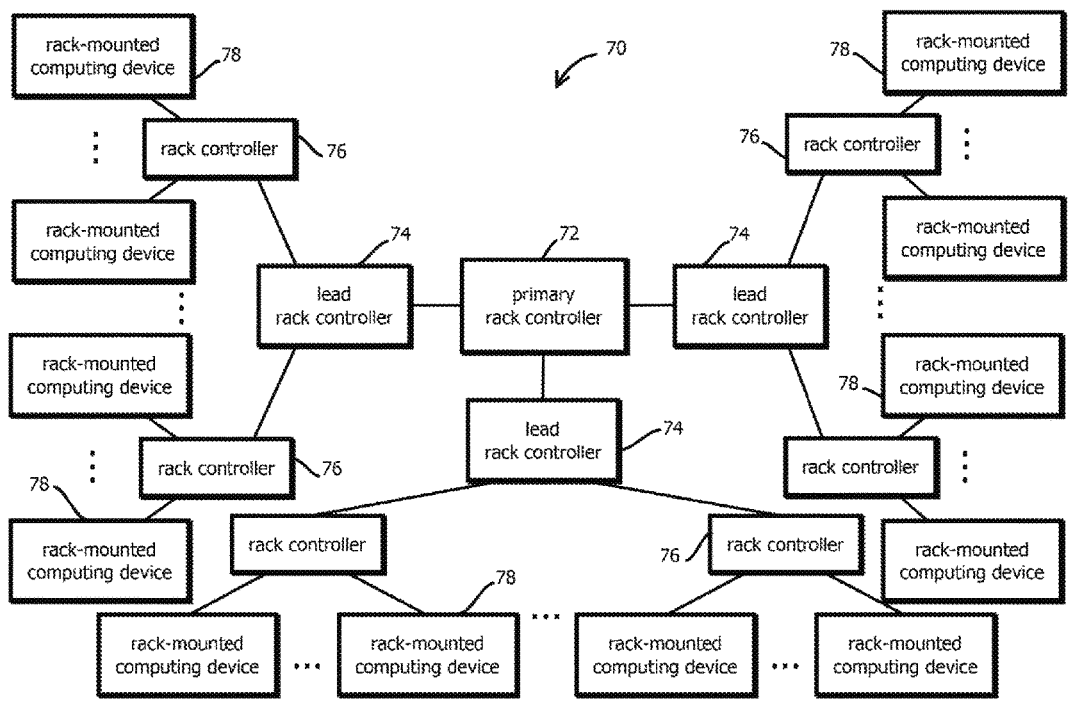
FIG. 7 is a block diagram of a topology of a data center management system, in accordance with some embodiments.
Figure 8:
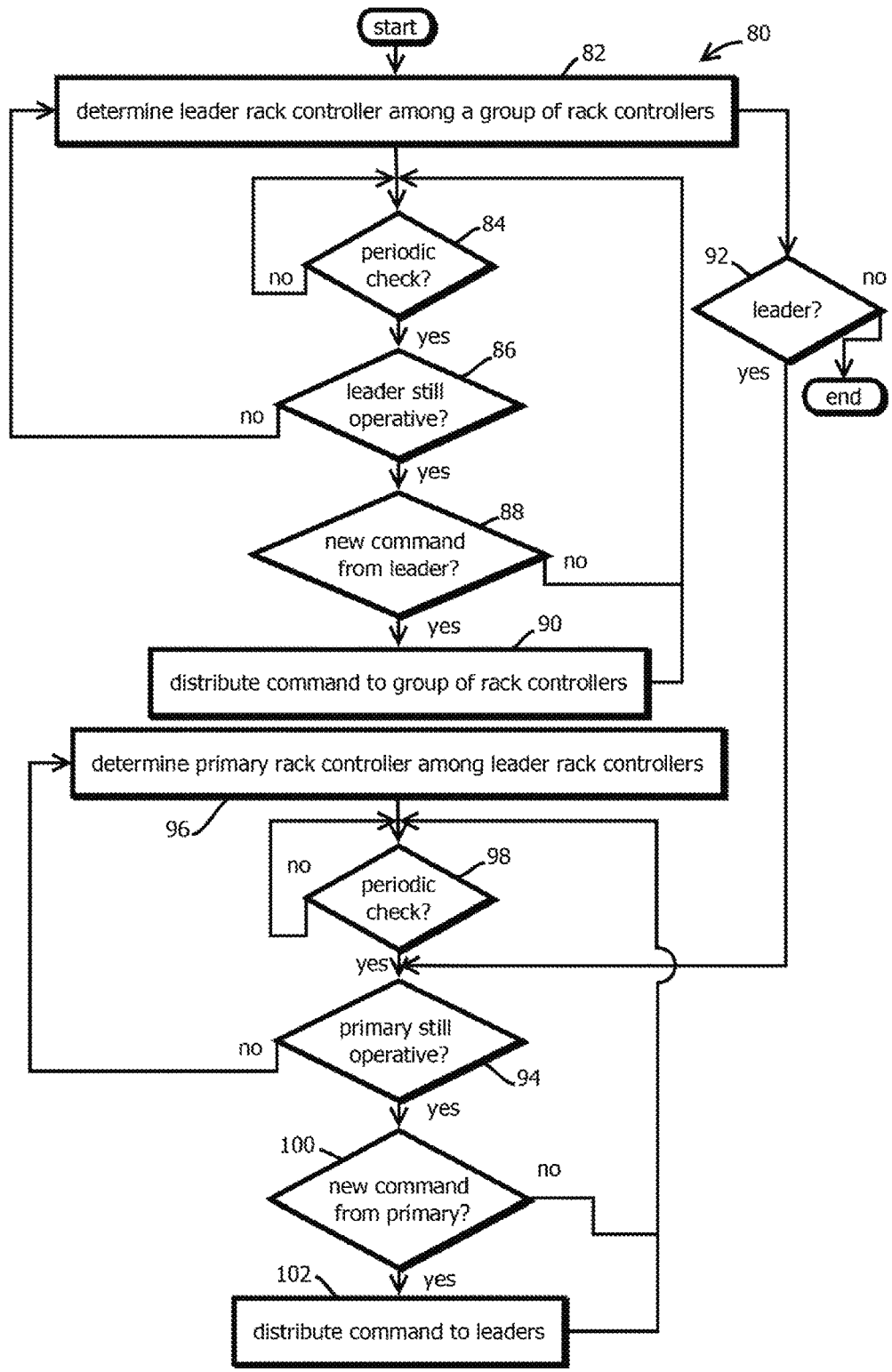
FIG. 8 is a flow chart that illustrates an example of a process executed by the system of FIG. 7 to manage a data center, in accordance with some embodiments.

FIGS. 7 and 8 depict techniques implemented in a system referred to as "Vapor Crate" for container, configuration, and file management for server/workload orchestration/automation.

In some embodiments of a collection of racks, such as a Vapor chamber described by the documents incorporated by reference, there are six wedges (each being a rack), where each wedge contains a Vapor Edge Controller (VECs) (or other type of rack control unit, like those described above, which may be dedicated computers coupled to a rack executing software to manage and monitor rack-mounted devices, like servers, or may be executed by the rack-mounted computing devices), used to host Vapor software such as Vapor CORE. The problem of how to configure and manage a large number of VECs (e.g., the rack controllers above) while reducing the amount of human intervention is worth addressing, as it may be difficult to manage all of the rack control units in a larger data center. In some cases, centralized management may present challenges. Relatively expensive, powerful computing equipment may be required for management tasks as the number of devices in a data center scales. Thus, at commercially relevant scales, computational resources may impose constraints, in addition to or independent of constraints imposed by out-of-band management networks, particularly when relatively large machine images, OS updates, and container images are distributed to a relatively large number of computing devices. That said, some embodiments may have a centralized control architecture, as the various other inventions described herein may also benefit such systems.

To mitigate some or all of these issues and others, in some embodiments, an autonomous management system called "Vapor Crate" (or Crate) is provided. Vapor Crate may carry out some or all of the following tasks:

Service discovery, file and configuration synchronization (e.g., with a system referred to as "Forklift")
Physical/logical mapping of management components based on role (e.g., with a system referred to as "Manifest")
Device (VEC) bootstrap (Forklift/bootstrap)
Configuration management (Manifest)
File management (Manifest)
Container management (e.g., with a system referred to as "Dockworker")
OS update management (e.g., with a system referred to as "Hoist")
UI Management (e.g., with Control Panel)

Crate may be implemented as a set of microservices, distributed across the rack controllers or VECs in a data center. The architecture parallels best practices in the data center industry surrounding fault-expectancy, redundancy, replication, security, configuration management, and decentralization. (Though embodiments are not limited to systems that implement best practices, which is not to imply that any other feature is limiting in all cases.) A feature of some implementations of Crate is to remain fully available to surviving equipment in the event of a large-sale system failure (e.g. power outage in part of a data center in which a device previously having a leadership role in Crate is taken offline). Another feature of some implementations is the ability to contain network traffic to a local branch of the data center management network, as the transfer of data involved with such an endeavor can be non-trivial. Finally, a feature of some implementations is a self-managing system that lowered operational cost by reducing or eliminating the need for operator intervention in managing hardware-management related software in a data center.

Vapor Crate, in some cases, includes service discovery and the ability to synchronize files and configuration. These capabilities may be provided by "Forklift", a service that is included with rack controllers or VECs (e.g., as part of the program code) that discovers or is configured with the optimal (e.g., a local or global optimum) "leader", which serves as the "master" for a given chamber (or other collection or racks). In some embodiments, the "leader" runs a redundant copy of all of the services listed above, typically within the scope of a single Vapor chamber or group of racks—the leader's services are synchronized to a "primary" rack controller or VEC, designated by consensus in the data center by the population of leaders. Updates may be made through the primary rack controller or VEC, and may be replicated to the leaders in the management unit. In case of failure of the 'primary', an election may be held by the consensus layer to choose a new primary, and the results of the election may be replicated out to all leaders.

In some cases, Forklift discovers the existing services (including in bootstrap scenarios where a rack controller or VEC is the first to be brought online in a data center), and discovers its own service profile, which specifies the services the rack controller or VEC is to run (for example, to serve as a leader, or as an instance running Vapor CORE). The Crate API may be used by Forklift to communicate with Manifest™ to retrieve file and configuration information, and the appropriate containers (services) are retrieved from Dockworker™, and are spun up using docker-compose or similar orchestration tool. When a container is started, in some embodiments, the Crate API may also be used within the container to retrieve from Manifest files or configuration information needed that is specialized to the VEC itself, allowing for a single image to be used, but configured to the needs of each individual rack controller or VEC where appropriate.

In some embodiments, OS updates may be provided by Hoist™, a reprepro Debian™ repository that may also contain specific package updates (e.g. to Forklift) as well. Hoist may provide a secure Debian™ repository for software, as many data center management networks (e.g., out-of-band networks) do not have outside network access. Additionally, Hoist™ may allow for auditing and curation of package updates to suit user needs. In some embodiments, Dockworker™ is included for a similar reason—access to Docker Hub™ is typically not possible for similar reasons in some implementations, and Dockworker™ therefore may fill that void, and allows for curation and auditing of packages. That said, other embodiments may have out-of-band management networks with Internet access.

Gatekeeper™ may be used to provide authentication services used to secure Crate, and may also be used as the authentication service for Vapor CORE or other products to provide fine-grained security from a single secure location.

Manifest may use MongoDB™ as the data store and MongoDB's GridFS for schematized file storage. In some cases, MongoDB also includes a consensus-based replication back-end that Crate piggybacks for its own consensus purposes—providing dual purpose consensus protocol and elections, as well as notification of election results.

The Crate API, in some embodiments, includes a lightweight object mapping that schematizes and validates object data exchanged between the API endpoint and MongoDB™. The API itself is may be implemented as a Python™ library that uses the object mapping to allow for ease of use by API consumers by providing a set of standard Python objects that may be exchanged between the API client and the endpoint. The API endpoint may be a RESTful API backed by Nginx™ and uWSGI, with Flask™ as the microdevelopment framework. Data may be exchanged in JSON format, and validated prior to interacting with the Manifest data store.

Some variations include a hosted management component to Crate, which is a service used to remotely manage Crate and Vapor services remotely, without the need for any customer intervention whatever. Other variations include interaction with OpenSwitch™ or other Network Operating Systems (NOSes), where Crate is used on a switch or as part of a NOS to perform management capabilities.

The form factor on which Crate runs may vary. In some embodiments, Crate may be implemented for rack controller or VEC management, or it may be applied to broader devops or automated systems management tasks.

Thus, some embodiments may implement control and updates at the rack-level, in a distributed, concurrent fashion to facilitate relatively large-scale operations. In some cases, activities specific to a rack can be handled locally at the rack level. To facilitate fan-out, some embodiments may distribute commands (which may include data by which the commands are implemented) through a hierarchical tree structure network graph, which in some cases may be established in part on an ad hoc, peer-to-peer, distributed basis. For instance, the rack-level may be at a lower level than a Vapor chamber, and some embodiments may distribute one request per chamber, and then that request may be replicated among the racks in that chamber. Examples may include instructions for file and configuration management (e.g., profiles), which may dictate how containers behave in each rack control unit. Embodiments may push out something like a service profile that says what each controller should be running, e.g., via REST-based exchange. To this end, for example, embodiments may send that file via an API to an endpoint, which may be an arbitrarily chosen controller (e.g., with a consensus algorithm). The designated rack control unit may then internally route that request to the known primary for the replicated database. The data may then be sent to the primary, which then replicates it out to the replicas, e.g., one rack control unit per chamber. Often updates entail applying the same thing to every chamber and every rack, or in some cases updates may designate the set of configuration and file data that is relevant to a particular class of machines or servers or racks. The determination to apply the received data may be made at replica or at the primary level.

An example of a profile change is a change in a setting in a configuration for a container. To effect the change, some embodiments may send instructions to a replica to change the setting and that setting may be committed to the database. In some embodiments, other rack control units may periodically check the designated master for updates, e.g., with a pull operation every minute, making an API request to the master requesting needed files. Some embodiments may have one master per chamber, and in some of these examples, anything pushed out to the primary gets pushed out to the masters/replicas. In some embodiments, if the primary fails, a new primary may be elected by consensus among the devices.

When initializing a rack or a data center, files may be distributed in a similar fashion to updates, with an arbitrarily chosen rack control unit acting as a seed. Upon boot, an initial master controller client that runs on rack control units may periodically query for updates. A laptop may be connected and initially be set to be the provisioning unit via the endpoint running on that particular machine, and other rack control unit may thereby obtain the files and settings from the laptop acting as a master. Then, some embodiments may change the settings of the chosen rack control unit to act as a master and seed distribution to other devices.

In some embodiments, a hierarchy of rack control units may be maintained to limit the number of participants in a distributed database. For instance, some may be designated management units, which may then replicate to devices lower in the hierarchy.

In other embodiments, other techniques may be used for configuring rack control units in a data center. For instance, some embodiments may use peer-to-peer file sharing protocols, like BitTorrent. In some embodiments, device discovery and data routing may be achieved with a distributed hash table algorithm executing on the participating rack control units (or other computers executing a rack controller). Such techniques, and those described above, are expected to make distributed computing systems run better than centralized management architectures, particularly as the number of nodes in a network scales and the amount of data to be distributed to each node expands. (This should not be taken as a disclaimer, though, of centralized architectures.) These techniques are also applicable to query routing and distributed processing. For instance, the commands may take the form of queries or MapReduce functions.

As noted above, in some embodiments, the rack controllers may communicate with one another. In some embodiments, the rack controllers may be updated, configured, monitored, queried, and otherwise accessed via a peer-to-peer data center management system 70. The illustrated system 70 has topology shown in FIG. 7, indicating the way in which information (such as commands, peer-to-peer networking overhead, and query responses) flows through the management system 70 to manage the rack controllers. In some cases, the topology represents connections at the application layer, which may be built over the network layer topology described above with reference to FIGS. 1-4. As discussed above, in some cases, the rack controllers are executed by dedicated computing devices associated with racks, or in some cases by rack-mounted computing devices to execute in band applications. In some embodiments, the illustrated topology may be formed by the rack controllers, using a peer-to-peer consensus protocol described below. In some embodiments, the topology may be a structured topology, such as a tree topology like that shown in FIG. 7, or in other embodiments, the topology may be an unstructured topology, e.g., in other forms of mesh topologies.

In some embodiments, the illustrated system may be relatively robust to failure by one member of the system, for instance, by one of the rack controllers. In some embodiments, for certain operations, remaining rack controllers may detect the failure of a given rack controller and continue operation, designating other rack controllers fill a role previously performed by a failed rack controller if that rack controller had a role significant to other parts of the system 70. In some cases, this may be accomplished with various consensus algorithms executed in a distributed fashion as described below with reference to FIG. 8, such as a leader-based consensus algorithm or a consensus algorithm that does not rely on a leader. Examples include the Raft consensus algorithm described in *Ongaro, Diego; Ousterhout, John* (2013). "In Search of an Understandable Consensus Algorithm" (the contents of which are hereby incorporated by reference), and the Paxos consensus algorithm described in *Lamport, Leslie* (May 1998). "The Part-Time Parliament" (PDF). ACM Transactions on Computer Systems 16, 2 (May 1998), 133-169 (the contents of which are hereby incorporated by reference), among others. In contrast, systems with rigid, predefined, unchangeable roles may be relatively sensitive to failure by any one computing device, as often those systems require human intervention to replace that one computing device or otherwise reconfigure the system. In contrast, some embodiments may be fault tolerant and resilient to failures by computing devices, applications therein, and network. That said, embodiments are not limited to systems that afford these benefits, as there are various independently useful techniques described herein, some of which are not based on consensus algorithms.

In the illustrated example, the rack controllers are arranged in a hierarchical tree in the topology of the management system 70. In FIG. 7, the differing modifiers of "primary" and "lead" should not be taken to indicate that, at least in some embodiments, the devices have a different architecture. Rather, in some embodiments, each of the devices illustrated in FIG. 7, in some embodiments, may be a (e.g., identical) instance of a peer rack controller, each controlling a rack in the fashion described above. The lead and primary controllers may be simply designated rack controllers that perform additional tasks based on their role. The topology may be determined by the rack controllers themselves, dynamically, by executing the routines described below with reference to FIG. 8, in some cases, without a human assigning the roles and arrangement shown in FIG. 7, and with the topology self-evolving to heal from the failure of devices. In this example, there are three levels to the topology. At the highest level is a primary rack controller 72. At a next lower level, adjacent the primary rack controller, and therefore in direct communication with the primary rack 72 are lead rack controller 74. Three rack controllers 74 are illustrated, but embodiments are consistent with substantially more, for instance on the order of more than 50 or more than 500. At the next level of the hierarchy, there are a plurality of rack controller 76. Each lead rack controller 74 may communicate directly with a plurality of rack controllers 76, in some cases with those rack controllers 76 communicating exclusively with the rack controller 74 through the management system 70 or purposes of management performed by the system 70. In some embodiments, each of the rack controllers 76 may control a plurality of rack-mounted computing devices 78 in the fashion described above. In some embodiments, the illustrated management systems 70 may be implemented in one or more of the above-described out-of-band networks. In some embodiments, management system may pass through the illustrated spanning tree, with replication chaining, thereby distributing communication load across the network and mitigating bottlenecks communication by which rack-mounted computing devices, racks, or rack controllers are controlled.

Control may take a variety of different forms. In some embodiments, a command may be sent by the primary rack controller to update an operating system of the rack controller or a rack-mounted computing device. In some embodiments, command may include an image of an operating system, in some cases, an image of an operating system, an application executed within the operating system, dependencies of that application may be included in the image. In another example, a container or microkernel may be configured or provisioned, for instance with a corresponding disk image stored in, and distributed through, the topology. In some cases, the command may be sent in sequence of messages, some including content by which the command is actuated and other messages including instructions to apply that content.

Other embodiments may include more or fewer levels to the hierarchy illustrated. For example, some embodiments may omit the primary rack controller 72, and commands may be distributed via chains spanning trees of the rack controllers 74 to the rack controller 76. Or some embodiments may include additional levels of hierarchy, for instance with a plurality of primary rack controllers that are adjacent a higher level "super-primary" rack controller.

In some embodiments, updates, settings, and other management content applied to rack controllers or rack-mounted computing devices, like operating systems, applications, microkernel, containers, configuration files, and the like they be stored in a distributed repository, such as a distributed file system, or a distributed document database. In some cases, a distributed repository may have a topology that mirrors that of the illustrated management system 70. For example, some embodiments may implement the MongoDB™ document database, in some cases with the illustrated topology within the database and content be replicated across multiple instances illustrated containers, thereby providing redundancy, fault tolerance, data storage, as well as management capabilities. Other examples may implement a clustered file system, such as the the InterPlanetary File System as a distributed file system. In some embodiments, the same consensus algorithm by which the management system determines, may be used to determine roles and authoritative copies of data in the distributed file system. In some cases, like in leaderless systems, roles may correspond to addresses within the topology of management content.

In some embodiments, the illustrated roles of the different rack controllers shown in FIG. 7 implement a distributed consensus protocol executed by the rack controllers. In some embodiments, the rack controllers may monitor the out-of-band network for a heartbeat signal, for instance in every few seconds, like every two seconds, sent by a leader among a group of rack controllers. Some embodiments may determine that that heartbeat signal has not been received within a threshold duration of time and in response initiates an election for a new leader. In some embodiments, each group of rack controllers, for instance, a plurality of 2 to 50, may have one designated leader for the group through which commands are distributed to the group, and through which information about the group is returned up through the illustrated tree of FIG. 7.

Upon determining that no leader heartbeat was received in time, and action is warranted, a given rack controller making this determination may send a message to other rack controllers in the group indicating that the given rack controller requests their vote in an election. In some embodiments, each rack controller may receive this message and to determine whether to vote for that given rack controller in response. This determination may be based on a variety of different considerations. For instance, each receiving rack controller may determine whether the group already has a leader and, in response, send a no vote (or decline to respond). In some embodiments, each receiving rack controller may determine whether the rack controller previously voted an election within less than a threshold duration of time, in which case the rack controller may vote no. In some embodiments, each rack controller may determine whether the rack controller already voted in the current election, in which case the rack controller may vote no. To this end, in some embodiments, when a given rack controller requests a vote, that rack controller may increment a count that serves as a unique identifier for an election attempt within the group, and other rack controllers may use this identifier sent with the vote request to determine whether they have already voted within a given election by logging their responses in memory and accessing this log to determine whether they already have a logged vote associated with the election attempt identifier. In another example, the receiving rack controller may determine whether the request is the first request received with the given election attempt and, in response, return with a yes vote to the first request received and a no vote to other requests. In another example, the vote requests may include a value indicative of a version of data stored in a distributed file system by the requesting rack controller, and receiving rack controllers may determine whether to vote for that rack controller based on whether they store a more up-to-date version or based on whether another rack controller has requested a vote with a more up-to-date version.

In some embodiments, each rack controller may send a heartbeat signal periodically, like every two seconds, to every rack controller in the respective group, and every rack controller in the group may receive these heartbeat signals and maintain a list of rack controller in the group. Based on this list, the rack controller requesting a vote may receive votes in its favor and determine whether more than a majority of votes in favor have been received by counting votes received and comparing the count to a threshold that is half the number of unique heartbeat signals received from members of the group. Upon receiving a majority of votes, and determining this to be the case, a given rack controller may determine that it has taken the role of a leader, communicate this to the group, and other rack controllers in the group may look to that rack controller as filling the role of leader.

Once leaders for each group are determined, in some cases, those leaders may determine the primary rack controller with a similar technique, with the leaders serving as the group in electing a member of the group to operate as a primary rack controller.

In some embodiments, the time thresholds for determining whether a given rack controller has failed may be adjusted according to a random value. Randomizing the threshold is expected to reduce the likelihood that different rack controllers call for elections concurrently with the group, thereby reducing the likelihood of tie elections delayed election results causing an election to be re-run.

At various times, various rack controllers filling various roles may fail. Failure does not require that the computing device cease operation, merely that the rack controller be perceived by other rack controllers to not perform at least part of the function corresponding to the role held by the rack controller. Examples include failure to send a heartbeat signal, or failure to send a command or other information through the topology 70 shown in FIG. 7 within a (e.g., randomized, like pseudorandomized) threshold duration of time. In some cases, durations of time since the last signal was received may serve as a health score for each rack controller, and these health scores may be propagated through the management system 70 according to the illustrated topology, with a given rack controller reporting health scores for those below it, and advancing those health scores upward, while distributing health scores for those upward to those below. This is expected to scale better relative to systems that implement a fully connected graph, though embodiments are also consistent with this approach.

FIG. 8 shows an example of a process 80 by which roles may be determined and management may be effectuated within a data center management system, such as that described above with reference to FIG. 7. In some embodiments, the process 80 includes determining a leader rack controller among a group a rack controllers, as indicated by block 82. In some cases, this operation may be performed when initializing a data center or in response to determining that a given previous leader rack controller is not responding. In some embodiments, determining a leader may include determining a leader through the techniques described above with a distributed consensus protocol, with a plurality of rack controllers with a group communicating with one another in order to select a leader (or primary) and arriving at a consensus regarding the selection.

Next, some embodiments may determine whether threshold duration has elapsed to receive a periodic signal (or other signal) from the leader, as indicated by block 84. In some cases, this may be receiving a heartbeat signal, or in some cases this may include a poor request, such as a request for a response indicating the help of the leader. In some cases, block 82 may be done in a distributed fashion by the group, while block 84 may be performed by each member of the group. Similarly, each member of the group may determine in response to the time elapsing in block 84 whether the leader is still operative, as indicated by block 86. As noted above, an inoperative leader may still be functioning, but not filling a portion of the role in the system, for instance in the event of a network failure. If the leader is not operative, some embodiments may determine a new leader rack controller and return to block 82, using the techniques described above.

If the leader is operative, some embodiments may determine whether there is a new command from the leader, as indicated by block 88. In some cases, the command may be a series of messages, such as a message instructing rack mounting computing device to retrieve information stored in a distributed file system, like an application update, descriptions of changing configurations, a container image, a disk image, and the like, and apply that management content to a respective rack controller with the command. In another example, the command may be a query to downstream rack controllers or a query to be translated and sent to downstream rack-mounted computing devices, for instance, with the techniques described above.

Upon determining that there are no commands, some embodiments may return to before block 84 and continue to wait for when for a periodic check that the leader is operative. In some cases, messages may be received between periodic heartbeats, for instance, with commands.

Upon determining that there is a new command, some embodiments may distribute the commands to the rack controllers under the respective leader. In some embodiments, these operations 82 through 90 may be executed concurrently, asynchronously, by a plurality of different groups within the data center, in some cases, with different groups selecting the leaders at different times.

In another example of a concurrent operation in some embodiments, upon determining a leader for the rack controller among a group rack controllers, each rack controller may determine whether it is itself a leader, as indicated by block 92. This concurrent branch may end when the answer is no. Those rack controllers that determine that they have been elected the leader, may proceed to block 94, in which the leader rack controllers may each determine whether there is a primary rack controller that is operative, as indicated by block 94. This determination may be similar to that of block 86 described above, with the group of leaders serving as the relevant group. Upon determining that the leader is not operative, some embodiments may determine a primary rack controller among the leader rack controllers, as indicated by block 96. This operation may include executing one or more of the above-described consensus protocols on the various leader rack controllers to elect a primary rack controller. Next, some embodiments may determine whether the time has arrived for a periodic check, as indicated by block 98. If the answer is no, some embodiments may continue waiting, or if the answer is yes, some embodiments may return to block 94 and determine whether the primary rack controllers still operative. If the primary rack controller is determined to be operative, some embodiments may determine whether there is new command from the primary rack, as indicated by block 100. Again, this operation may include the operations described above with respect to block 88, except from the perspective of a leader. The operations of blocks 98, 94, and 100 may be performed by each leader rack controller concurrently and asynchronously, and the operation of block 96 may be performed collectively by the leader rack controllers. Upon determining that there is no new command, some embodiments may return to block 98 and continue waiting for a periodic check or new command.

In some cases, new commands may be pushed, without waiting to make a determination whether a new command is available. Upon determining that a new command is available, some embodiments may distribute the command to the leader rack controllers, as indicated by block 102. This operation may include the operations described above with reference to block 90, except from the perspective of leader rack controller. The distribution of block 102 may cause a positive response in the determination of block 88 above. Thus, new commands may be fanned out throughout a topology of rack controllers without forming a bottleneck at any one rack controller, and the distribution may be accomplished in a way that is relatively fault-tolerant to the failure of any one rack controller of the data center management system 70. In some embodiments, the content by which the commands are implemented, which may include relatively large files including operating systems, containers, applications, dependencies, and configuration settings, may be distributed in the same or a similar fashion, thereby also distributing the relatively bandwidth heavy load throughout the data center and avoiding bottlenecks, while also remaining resilient to failures. Again, it should be noted that several inventions are described, and those inventions may be viewed independently, so these benefits may not be afforded by all embodiments consistent with the present description.

Figure 9:
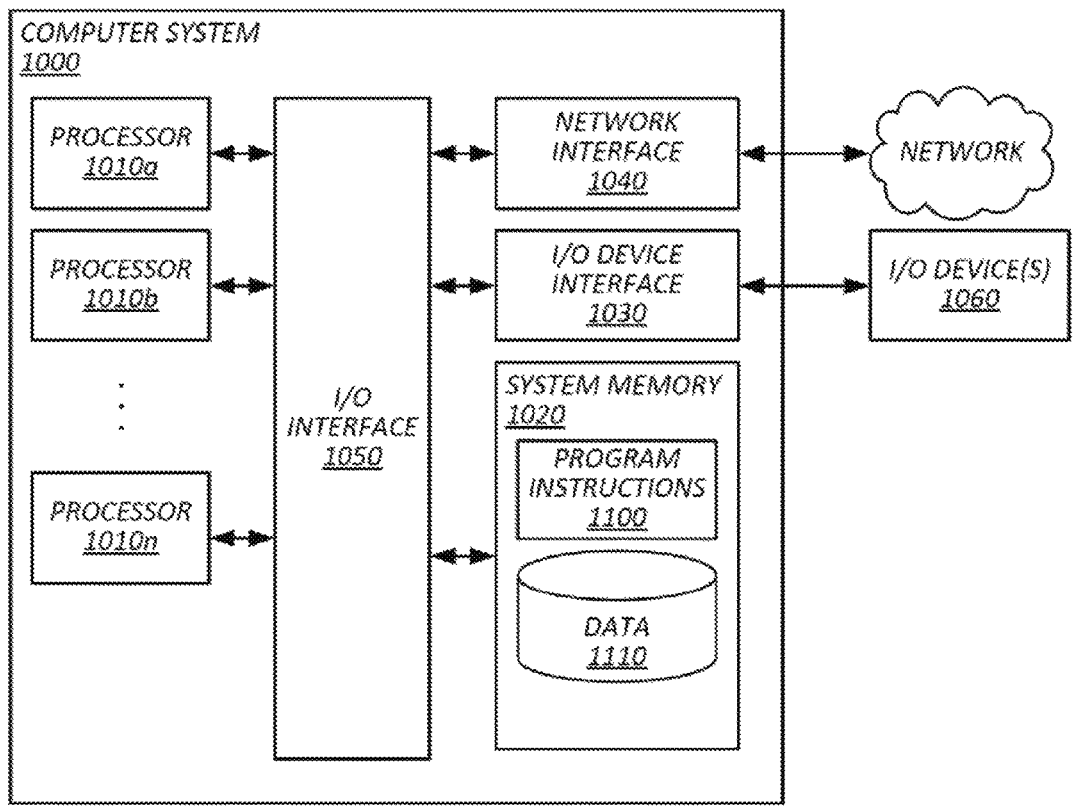
FIG. 9 is a diagram that illustrates an exemplary computing system by which the above processes and systems may be implemented, in accordance with embodiments of the present techniques.

FIG. 9 is a diagram that illustrates an exemplary computing system 1000 in accordance with embodiments of the present technique. In some cases, each rack of the above-described racks may house one or more of these systems 1000. Various portions of systems and methods described herein, may include or be executed on one or more computer systems similar to computing system 1000. Further, processes and modules described herein may be executed by one or more processing systems similar to that of computing system 1000.

Computing system 1000 may include one or more processors (e.g., processors 1010a-1010n) coupled to system memory 1020, an input/output I/O device interface 1030, and a network interface 1040 via an input/output (I/O) interface 1050. A processor may include a single processor or a plurality of processors (e.g., distributed processors). A processor may be any suitable processor capable of executing or otherwise performing instructions. A processor may include a central processing unit (CPU) that carries out program instructions to perform the arithmetical, logical, and input/output operations of computing system 1000. A processor may execute code (e.g., processor firmware, a protocol stack, a database management system, an operating system, or a combination thereof) that creates an execution environment for program instructions. A processor may include a programmable processor. A processor may include general or special purpose microprocessors. A processor may receive instructions and data from a memory (e.g., system memory 1020). Computing system 1000 may be a uni-processor system including one processor (e.g., processor 1010a), or a multi-processor system including any number of suitable processors (e.g., 1010a-1010n). Multiple processors may be employed to provide for parallel or sequential execution of one or more portions of the techniques described herein. Processes, such as logic flows, described herein may be performed by one or more programmable processors executing one or more computer programs to perform functions by operating on input data and generating corresponding output. Processes described herein may be performed by, and apparatus can also be implemented as, special purpose logic circuitry, e.g., an FPGA (field programmable gate array) or an ASIC (application specific integrated circuit). Computing system 1000 may include a plurality of computing devices (e.g., distributed computer systems) to implement various processing functions.

I/O device interface 1030 may provide an interface for connection of one or more I/O devices 1060 to computer system 1000. I/O devices may include devices that receive input (e.g., from a user) or output information (e.g., to a user). I/O devices 1060 may include, for example, graphical user interface presented on displays (e.g., a cathode ray tube (CRT) or liquid crystal display (LCD) monitor), pointing devices (e.g., a computer mouse or trackball), keyboards, keypads, touchpads, scanning devices, voice recognition devices, gesture recognition devices, printers, audio speakers, microphones, cameras, or the like. I/O devices 1060 may be connected to computer system 1000 through a wired or wireless connection. I/O devices 1060 may be connected to computer system 1000 from a remote location. I/O devices 1060 located on remote computer system, for example, may be connected to computer system 1000 via a network and network interface 1040.

Network interface 1040 may include a network adapter that provides for connection of computer system 1000 to a network. Network interface may 1040 may facilitate data exchange between computer system 1000 and other devices connected to the network. Network interface 1040 may support wired or wireless communication. The network may include an electronic communication network, such as the Internet, a local area network (LAN), a wide area network (WAN), a cellular communications network, or the like.

System memory 1020 may be configured to store program instructions 1100 or data 1110. Program instructions 1100 may be executable by a processor (e.g., one or more of processors 1010a-1010n) to implement one or more embodiments of the present techniques. Instructions 1100 may include modules of computer program instructions for implementing one or more techniques described herein with regard to various processing modules. Program instructions may include a computer program (which in certain forms is known as a program, software, software application, script, or code). A computer program may be written in a programming language, including compiled or interpreted languages, or declarative or procedural languages. A computer program may include a unit suitable for use in a computing environment, including as a stand-alone program, a module, a component, or a subroutine. A computer program may or may not correspond to a file in a file system. A program may be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program may be deployed to be executed on one or more computer processors located locally at one site or distributed across multiple remote sites and interconnected by a communication network.

System memory 1020 may include a tangible program carrier having program instructions stored thereon. A tangible program carrier may include a non-transitory computer readable storage medium. A non-transitory computer readable storage medium may include a machine readable storage device, a machine readable storage substrate, a memory device, or any combination thereof. Non-transitory computer readable storage medium may include non-volatile memory (e.g., flash memory, ROM, PROM, EPROM, EEPROM memory), volatile memory (e.g., random access memory (RAM), static random access memory (SRAM), synchronous dynamic RAM (SDRAM)), bulk storage memory (e.g., CD-ROM or DVD-ROM, hard-drives), or the like. System memory 1020 may include a non-transitory computer readable storage medium that may have program instructions stored thereon that are executable by a computer processor (e.g., one or more of processors 1010a-1010n) to cause the subject matter and the functional operations described herein. A memory (e.g., system memory 1020) may include a single memory device or a plurality of memory devices (e.g., distributed memory devices).

I/O interface 1050 may be configured to coordinate I/O traffic between processors 1010a-1010n, system memory 1020, network interface 1040, I/O devices 1060, or other peripheral devices. I/O interface 1050 may perform protocol, timing, or other data transformations to convert data signals from one component (e.g., system memory 1020) into a format suitable for use by another component (e.g., processors 1010a-1010n). I/O interface 1050 may include support for devices attached through various types of peripheral buses, such as a variant of the Peripheral Component Interconnect (PCI) bus standard or the Universal Serial Bus (USB) standard.

Embodiments of the techniques described herein may be implemented using a single instance of computer system 1000 or multiple computer systems 1000 configured to host different portions or instances of embodiments. Multiple computer systems 1000 may provide for parallel or sequential processing/execution of one or more portions of the techniques described herein.

Those skilled in the art will appreciate that computer system 1000 is merely illustrative and is not intended to limit the scope of the techniques described herein. Computer system 1000 may include any combination of devices or software that may perform or otherwise provide for the performance of the techniques described herein. For example, computer system 1000 may include or be a combination of a cloud-computing system, a data center, a server rack, a server, a virtual server, a desktop computer, a laptop computer, a tablet computer, a server device, a client device, a mobile telephone, a personal digital assistant (PDA), a mobile audio or video player, a game console, a vehicle-mounted computer, or a Global Positioning System (GPS), or the like. Computer system 1000 may also be connected to other devices that are not illustrated, or may operate as a stand-alone system. In addition, the functionality provided by the illustrated components may in some embodiments be combined in fewer components or distributed in additional components. Similarly, in some embodiments, the functionality of some of the illustrated components may not be provided or other additional functionality may be available.

Those skilled in the art will also appreciate that while various items are illustrated as being stored in memory or on storage while being used, these items or portions of them may be transferred between memory and other storage devices for purposes of memory management and data integrity. Alternatively, in other embodiments some or all of the software components may execute in memory on another device and communicate with the illustrated computer system via inter-computer communication. Some or all of the system components or data structures may also be stored (e.g., as instructions or structured data) on a computer-accessible medium or a portable article to be read by an appropriate drive, various examples of which are described above. In some embodiments, instructions stored on a computer-accessible medium separate from computer system 1000 may be transmitted to computer system 1000 via transmission media or signals such as electrical, electromagnetic, or digital signals, conveyed via a communication medium such as a network or a wireless link. Various embodiments may further include receiving, sending, or storing instructions or data implemented in accordance with the foregoing description upon a computer-accessible medium. Accordingly, the present invention may be practiced with other computer system configurations.

The reader should appreciate that the present application describes several inventions. Rather than separating those inventions into multiple isolated patent applications, applicants have grouped these inventions into a single document because their related subject matter lends itself to economies in the application process. But the distinct advantages and aspects of such inventions should not be conflated. In some cases, embodiments address all of the deficiencies noted herein, but it should be understood that the inventions are independently useful, and some embodiments address only a subset of such problems or offer other, unmentioned benefits that will be apparent to those of skill in the art reviewing the present disclosure. Due to cost constraints, some inventions disclosed herein may not be presently claimed and may be claimed in later filings, such as continuation applications or by amending the present claims. Similarly, due to space constraints, neither the Abstract nor the Summary of the Invention sections of the present document should be taken as containing a comprehensive listing of all such inventions or all aspects of such inventions.

It should be understood that the description and the drawings are not intended to limit the invention to the particular form disclosed, but to the contrary, the intention is to cover all modifications, equivalents, and alternatives falling within the spirit and scope of the present invention as defined by the appended claims. Further modifications and alternative embodiments of various aspects of the invention will be apparent to those skilled in the art in view of this description. Accordingly, this description and the drawings are to be construed as illustrative only and are for the purpose of teaching those skilled in the art the general manner of carrying out the invention. It is to be understood that the forms of the invention shown and described herein are to be taken as examples of embodiments. Elements and materials may be substituted for those illustrated and described herein, parts and processes may be reversed or omitted, and certain features of the invention may be utilized independently, all as would be apparent to one skilled in the art after having the benefit of this description of the invention. Changes may be made in the elements described herein without departing from the spirit and scope of the invention as described in the following claims. Headings used herein are for organizational purposes only and are not meant to be used to limit the scope of the description.

As used throughout this application, the word "may" is used in a permissive sense (i.e., meaning having the potential to), rather than the mandatory sense (i.e., meaning must). The words "include", "including", and "includes" and the like mean including, but not limited to. As used throughout this application, the singular forms "a," "an," and "the" include plural referents unless the content explicitly indicates otherwise. Thus, for example, reference to "an element" or "a element" includes a combination of two or more elements, notwithstanding use of other terms and phrases for one or more elements, such as "one or more." The term "or" is, unless indicated otherwise, non-exclusive, i.e., encompassing both "and" and "or." Terms describing conditional relationships, e.g., "in response to X, Y," "upon X, Y,", "if X, Y," "when X, Y," and the like, encompass causal relationships in which the antecedent is a necessary causal condition, the antecedent is a sufficient causal condition, or the antecedent is a contributory causal condition of the consequent, e.g., "state X occurs upon condition Y obtaining" is generic to "X occurs solely upon Y" and "X occurs upon Y and Z." Such conditional relationships are not limited to consequences that instantly follow the antecedent obtaining, as some consequences may be delayed, and in conditional statements, antecedents are connected to their consequents, e.g., the antecedent is relevant to the likelihood of the consequent occurring. Statements in which a plurality of attributes or functions are mapped to a plurality of objects (e.g., one or more processors performing steps A, B, C, and D) encompasses both all such attributes or functions being mapped to all such objects and subsets of the attributes or functions being mapped to subsets of the attributes or functions (e.g., both all processors each performing steps A-D, and a case in which processor 1 performs step A, processor 2 performs step B and part of step C, and processor 3 performs part of step C and step D), unless otherwise indicated. Further, unless otherwise indicated, statements that one value or action is "based on" another condition or value encompass both instances in which the condition or value is the sole factor and instances in which the condition or value is one factor among a plurality of factors. Unless specifically stated otherwise, as apparent from the discussion, it is appreciated that throughout this specification discussions utilizing terms such as "processing," "computing," "calculating," "determining" or the like refer to actions or processes of a specific apparatus, such as a special purpose computer or a similar special purpose electronic processing/computing device.

The present techniques will be better understood with reference to the following enumerated embodiments:

1. A tangible, non-transitory, machine-readable medium storing instructions that when executed by one or more processors of a rack-controller effectuate operations to control a plurality of rack-mounted computing devices, the operations comprising: receiving, with a rack-controller, via a first network, an application program interface (API) request, wherein: the rack-controller is configured to control a plurality of rack-mounted computing devices mounted in a plurality of different rack units of one or more racks; the rack-controller is configured to control the rack-mounted computing devices via a second network, different from the first network; the rack-controller includes a gateway between the first network and the second network; the second network is an out-of-band network distinct from an in-band network with which data is conveyed between rack-mounted computing devices or between rack-mounted computing devices and the internet; and the API request is encoded in a first protocol; based on the API request, selecting, with the rack-controller, one of a plurality of routines to effectuate control via the second network of at least some of the plurality of rack-mounted computing devices, the plurality of routines including: a first routine that reads a sensor via the second network on one of the rack-mounted computing devices; a second routine that reads a sensor via the second network on the rack but not on one of the rack-mounted computing devices; a third routine that scans computing devices on the second network and produces an inventory of the scanned computing devices on the second network; a fourth routine by which a configuration of an extensible firmware interface (EFI) of a given one of the rack-mounted computing device is adjusted; and executing, with the rack-controller, the selected routine and, as a result, sending one or more commands via the second network encoded in a second protocol different from the first protocol to effectuate an action indicated by the API request.

2. The medium of embodiment 1, wherein: the rack-controller is an out-of-band computer having a processor, memory, an operating system stored in persistent memory; the rack-controller is coupled to a rack in which the rack-mounted computing devices are disposed; the number of rack-mounted computing devices controlled by the rack-controller exceeds seven; the rack-controller is not on the in-band network; the first network is an out-of-band Ethernet network; the second network is a direct-current (DC) power-line network with which both power and data are conveyed via a DC power bus; the first protocol is a hypertext transport protocol and the API is a representational state transfer API; the sensor is a temperature sensor; the configuration of the EFI specifies a boot device of the given rack-mounted computing device; at least some of the routines do not use a baseboard management controller of the rack-mounted computing devices; the selected routine is the first routine; the operations comprise: receiving, with the rack-controller, a response from the temperature sensor in units other than units of temperature; converting, with the rack-controller, the response into units of temperature; and sending, with the rack-controller, via the first network, an HTTP response including the converted response in units of temperature.

3. The medium of any one of embodiments 1-2, wherein: the second network connects a control plane of a rack over which a plurality of servers mounted in the rack are controlled; and the first network is an out-of-band network over which a data center is managed based on workload and environmental data gathered from a plurality of racks via a plurality of respective instances of the first network.

4. The medium of any one of embodiments 1-3, wherein: the plurality of routines comprises a fifth routine by which a rack-mounted computing device is power cycled; the fifth routine is selected; and the operations comprise: sending, with the rack-controller, via the second network, an instruction that causes a given rack-mounted computing device to power cycle; receiving, with the rack-controller, via the second network, one or more power-on-self-test (POST) codes; and sending, with the rack-controller, via the first network, an indication of the one or more POST codes.

5. The medium of any one of embodiments 1-4, wherein: the third routine is selected; the operations comprise: sending, with the rack-controller, via the second network, to each device on the second network, a command to send an identifier; receiving, with the rack-controller, during each of a plurality of durations of time reserved for respective ones of the devices to use a shared physical medium of the second network, an identifier from the respective devices.

6. The medium of any one of embodiments 1-5, wherein: the third routine is selected; the operations comprise: sending, with the rack-controller, via the second network, and a modem coupled a mid-plane of a server, a command to a computing device coupled to the server and the modem, the command causing the computing device to execute a scan of other computing devices coupled to a system management bus of server; receiving, with the rack-controller, from the modem, via the second network, identifiers of at least some computing devices detected in scan.

7. The medium of any one of embodiments 1-6, wherein: the fourth routine is selected; the operations comprise: receiving, with the rack-controller, via the first network, an a new version of the EFI; sending, with the rack-controller, via the second network, the new version of the EFI to a given one of the rack-mounted computing devices and instructions to store the new version of the EFI at given boot target of a plurality of candidate boot targets of the given one of the rack-mounted computing devices; sending, with the rack-controller, via the second network, to the given rack-mounted computing device, an instruction to change a boot target of the EFT to the given boot target; and sending, with the rack-controller, via the second network, an instruction reboot the given one of the rack-mounted computing devices.

8. the medium of any one of embodiments 1-7, wherein: the fourth routine is selected; and the operations comprise: changing a boot target of an EFI of at least one of the rack-mounted computing devices without making the change via an Intelligent Platform Management Interface (IPMI) of at least one of the rack-mounted computing devices.

9. The medium of any one of embodiments 1-8, wherein the operations comprise: gathering, with the rack-controller, via the second network, agentless monitoring metrics from each of the rack-mounted computing devices, the metrics including processor utilization of the respective rack-mounted computing devices.

10. The medium of embodiment 9, wherein: wherein the agentless monitoring metrics are not reported by an operating system or a process running within the operating system of the rack-mounted computing devices, and wherein the metrics include memory utilization and an indication of processor temperature.

11. The medium of any one of embodiments 1-10, wherein: the second network is power-line network by which both electrical power is supplied to the rack-mounted computing devices and by which data is exchanged.

12. The medium of any one of embodiments 1-10, wherein: the second network is an Ethernet network.

13. The medium of any one of embodiments 1-12, wherein: at least two of the routines are not effectuated via a baseboard management controller of the rack-mounted computing devices.

14. The medium of 13, wherein the operations comprise: causing a component identifier of a component of one of the rack-mounted computing devices to be read from a register of the component and conveyed via a system management bus of the one of the rack-mounted computing devices before being sent to the rack-controller via the second network.

15. The medium of embodiment 14, wherein the operations comprise: receiving, with the rack-controller, the component identifier; selecting a command corresponding to a capability of the component based on the component identifier; and sending, with the rack-controller, via the second network, the selected command.

16. The medium of embodiment 14, wherein: reading from the register comprises incrementing an address through an address space of the system management bus until an address of the component is found.

17. The medium of any one of embodiments 1-16, wherein: the routines comprise a routine by which TTY access to a remote console executing on one of the rack-mounted computing devices is provided, wherein the rack-controller operates as a web proxy in the TTY access.

18. The medium of any one of embodiments 1-17, wherein: the first routine is selected with means for selecting a routine based on an API request; the sensor comprises means for sensing; and the rack-controller comprises means for controlling a rack.

19. The medium of embodiment 1, wherein: the rack controller is executed in an out-of-band computer having a processor and memory storing instructions that when executed effectuate at least some of the operations of embodiment 1; the rack controller is configured to manage rack-mounted computing devices via the second network with a power-line communication network.

20. The medium of embodiment 1, wherein: the rack controller is configured to be executed in a rack-mounted computing device; and the second network is an Ethernet network.

21. The medium of embodiment 1, wherein: the rack controller is configured to be executed in a rack-mounted computing device; and the rack controller is configured to manage rack-mounted computing devices via the second network with a power-line communication network.

22. The method of embodiment 1, wherein: the rack controller is executed in an out-of-band computer having a processor and memory storing instructions that when executed effectuate at least some of the operations of embodiment 1; and the second network is an Ethernet network.

23. A data center, comprising: a data center management computing device communicatively coupled to an out-of-band network; and a plurality of racks, each rack comprising: a plurality of rack-mounted computing devices within the plurality of racks and communicatively coupled to an in-band network; a rack-controller communicatively coupled to the data center management computing device via the out-of-band network; a powerline network having a rack-specific network address space independent of address spaces of other powerline networks of other racks; a plurality of powerline modems each associated with a respective one or more of the rack-mounted computing devices; and a tangible, non-transitory, machine-readable medium of the rack controller storing instructions that when executed by the rack-controller effectuate operations comprising: receiving, with a rack-controller, via the out-of-band network, a request; based on the request, selecting, with the rack-controller, one of a plurality of routines to effectuate control via the second network of at least some of the plurality of rack-mounted computing devices, the plurality of routines including at least two of the following: a first routine that reads a sensor via the second network on one of the rack-mounted computing devices; a second routine that reads a sensor via the second network on the rack but not on one of the rack-mounted computing devices; a third routine that scans computing devices on the second network and produces an inventory of the scanned computing devices on the second network; or a fourth routine by which a configuration of an extensible firmware interface (EFI) of a given one of the rack-mounted computing device is adjusted; and executing, with the rack-controller, the selected routine and, as a result, sending one or more commands via the powerline network to effectuate an action in response to the request.

24. A method, comprising: the operations of any one of embodiments 1-23.

What is claimed is:

1. A tangible, non-transitory, machine-readable medium storing instructions that when executed by one or more processors of a rack-controller effectuate operations to control a plurality of rack-mounted computing devices, the operations comprising:
    receiving, with the rack-controller, via a first network, at least two application program interface (API) requests, wherein:
        the rack-controller is configured to control the plurality of rack-mounted computing devices mounted in a plurality of different rack units of one or more racks;
        the rack-controller is configured to control the rack-mounted computing devices via a second network of one or more out-of-band networks distinct from an in-band network with which data is conveyed between rack-mounted computing devices or between rack-mounted computing devices and the internet and different from the first network;
        the rack-controller includes a gateway between the first network and the second network; and
        the at least two API requests are encoded in a first protocol;
    based on a first one of the API requests, selecting, with the rack-controller, a first one of a plurality of routines to effectuate control via the second network of a first group of the plurality of rack-mounted computing devices, the plurality of routines including:
        a first routine that reads a sensor via the second network on one of the rack-mounted computing devices;
        a second routine that reads a sensor via the second network on the rack but not on one of the rack-mounted computing devices;
        a third routine that scans computing devices on the second network and produces an inventory of the scanned computing devices on the second network;
        a fourth routine by which a configuration of an extensible firmware interface (EFI) of a given one of the rack-mounted computing device is adjusted; and
        a fifth routine by which a rack-mounted computing device is power cycled;
    based on a second one of the API requests, selecting, with the rack-controller, a second one of the plurality of routines to effectuate control via the second network of a second group of the plurality of rack-mounted computing devices, wherein the second selected routine is the fifth routine; and
    executing, with the rack-controller,
        the first selected routine and, as a result, sending one or more commands via the second network encoded in a second protocol different from the first protocol to effectuate an action indicated by the first API request, and
        the second selected routine, and, as a result, sending one or more commands via the second network encoded in a third protocol different from the first protocol to power cycle the second group of the plurality of rack-mounted computing devices, receiving via the second network one or more power-on-self-test (POST) codes, and sending via the first network an indication of the one or more POST codes.

2. The medium of claim 1, wherein:
the rack-controller is an out-of-band computer having an operating system stored in persistent memory;
the rack-controller is coupled to a rack in which the rack-mounted computing devices are disposed;
the number of rack-mounted computing devices controlled by the rack-controller exceeds seven;
the rack-controller is not on the in-band network;
the first network is an out-of-band Ethernet network;
the second network comprises a direct-current (DC) power-line network with which both power and data are conveyed via a DC power bus;
the first protocol is a hypertext transport protocol and the API is a representational state transfer API;
the sensor read by the first routine is a temperature sensor;
the configuration of the EFI specifies a boot device of the given rack-mounted computing device;
at least some of the routines do not use a baseboard management controller of the rack-mounted computing devices;
the first selected routine is the first routine; and
executing, with the rack-controller, the first selected routine comprises:
    receiving, with the rack-controller, a response from the temperature sensor in units other than units of temperature;
    converting, with the rack-controller, the response into units of temperature; and
    sending, with the rack-controller, via the first network, an HTTP response including the converted response in units of temperature.

3. The medium of claim 1, wherein:
the second network connects a control plane of a rack over which a plurality of servers mounted in the rack are controlled; and
the first network is an out-of-band network over which a data center is managed based on workload and environmental data gathered from a plurality of racks via a plurality of respective instances of the first network.

4. The medium of claim 1, wherein:
the first selected routine is the third routine; and
executing, with the rack-controller, the first selected routine comprises:
  sending, with the rack-controller, via the second network, to each device on the second network, a command to send an identifier; and
  receiving, with the rack-controller, during each of a plurality of durations of time reserved for respective ones of the devices to use a shared physical medium of the second network, an identifier from the respective devices.

5. The medium of claim 1, wherein:
the first selected routine is the third routine; and
executing, with the rack-controller, the first selected routine comprises:
  sending, with the rack-controller, via the second network, and a modem coupled a mid-plane of a server, a command to a computing device coupled to the server and the modem, the command causing the computing device to execute a scan of other computing devices coupled to a system management bus of server; and
  receiving, with the rack-controller, from the modem, via the second network, identifiers of at least some computing devices detected in scan.

6. The medium of claim 1, wherein:
the first selected routine is the fourth routine; and
executing, with the rack-controller, the first selected routine comprises:
  receiving, with the rack-controller, via the first network, a new version of the EFI;
  sending, with the rack-controller, via the second network, the new version of the EFI to a given one of the rack-mounted computing devices and instructions to store the new version of the EFI at given boot target of a plurality of candidate boot targets of the given one of the rack-mounted computing devices;
  sending, with the rack-controller, via the second network, to the given rack-mounted computing device, an instruction to change a boot target of the EFI to the given boot target; and
  sending, with the rack-controller, via the second network, an instruction to reboot the given one of the rack-mounted computing devices.

7. The medium of claim 1, wherein:
the first selected routine is the fourth routine; and
executing, with the rack-controller, the first selected routine comprises:
  changing a boot target of an EFI of at least one of the rack-mounted computing devices without making the change via an Intelligent Platform Management Interface (IPMI) of at least one of the rack-mounted computing devices.

8. The medium of claim 1, wherein the operations comprise:
  gathering, with the rack-controller, via the second network, agentless monitoring metrics from each of the rack-mounted computing devices, the metrics including processor utilization of the respective rack-mounted computing devices.

9. The medium of claim 8, wherein:
the agentless monitoring metrics are not reported by an operating system or a process running within the operating system of the rack-mounted computing devices, and wherein the metrics include memory utilization and an indication of processor temperature.

10. The medium of claim 1, wherein:
the second network comprises an out-of-band power-line network by which both electrical power is supplied to the rack-mounted computing devices and by which data is exchanged.

11. The medium of claim 1, wherein:
the second network comprises an out-of-band Ethernet network.

12. The medium of claim 1, wherein:
at least two of the routines are not effectuated via a baseboard management controller of the rack-mounted computing devices.

13. The medium of claim 1, wherein the operations comprise:
  causing a component identifier of a component of one of the rack-mounted computing devices to be read from a register of the component and conveyed via a system management bus of the one of the rack-mounted computing devices before being sent to the rack-controller via the second network.

14. The medium of claim 13, wherein the operations comprise:
  receiving, with the rack-controller, the component identifier;
  selecting a command corresponding to a capability of the component based on the component identifier; and
  sending, with the rack-controller, via the second network, the selected command.

15. The medium of claim 13, wherein:
reading from the register comprises querying a value of the register of the component, the component identified by a scan of an address space of the system management bus of the one of the rack-mounted computing devices.

16. The medium of claim 1, wherein:
the routines comprise a routine by which access to a remote console executing on one of the rack-mounted computing devices is provided, wherein the rack-controller operates as a web proxy providing remote console access.

17. The medium of claim 1, wherein:
the first routine is selected as the first selected routine with means for selecting a routine based on an API request;
the sensor comprises means for sensing; and
the rack-controller comprises means for controlling a rack.

18. The medium of claim 1, wherein:
the rack controller is executed in an out-of-band computer having a processor and memory storing instructions that when executed effectuate at least some of the operations of claim 1; and
the rack controller is configured to manage rack-mounted computing devices via the second network with an out-of-band power-line communication network.

19. The medium of claim 1, wherein:
the rack controller is configured to be executed in a rack-mounted computing device; and
the second network comprises an out-of-band Ethernet network.

20. The medium of claim 1, wherein:
the rack controller is configured to be executed in a rack-mounted computing device; and
the rack controller is configured to manage rack-mounted computing devices via the second network with an out-of-band power-line communication network.

21. The medium of claim 1, wherein:
the rack controller is executed in an out-of-band computer having a processor and memory storing instructions that when executed effectuate at least some of the operations of claim 1; and
the second network comprises an out-of-band Ethernet network.

22. A method, comprising:
receiving, with a rack-controller, via a first network, at least two application program interface (API) requests, wherein:
  the rack-controller is configured to control a plurality of rack-mounted computing devices mounted in a plurality of different rack units of one or more racks;
  the rack-controller is configured to control the rack-mounted computing devices via a second network of one or more out-of-band networks distinct from an in-band network with which data is conveyed between rack-mounted computing devices or between rack-mounted computing devices and the internet and different from the first network;
  the rack-controller includes a gateway between the first network and the second network; and
  the at least two API requests are encoded in a first protocol;
based on a first one of the API requests, selecting, with the rack-controller, a first one of a plurality of routines to effectuate control via the second network of a first group of the plurality of rack-mounted computing devices, the plurality of routines including:
  a first routine that reads a sensor via the second network on one of the rack-mounted computing devices;
  a second routine that reads a sensor via the second network on the rack but not on one of the rack-mounted computing devices;
  a third routine that scans computing devices on the second network and produces an inventory of the scanned computing devices on the second network;
  a fourth routine by which a configuration of an extensible firmware interface (EFI) of a given one of the rack-mounted computing device is adjusted; and
  a fifth routine by which a rack-mounted computing device is power cycled;
based on a second one of the API requests, selecting, with the rack-controller, a second one of the plurality of routines to effectuate control via the second network of a second group of the plurality of rack-mounted computing devices, wherein the second selected routine is the fifth routine; and
executing, with the rack-controller,
  the first selected routine and, as a result, sending one or more commands via the second network encoded in a second protocol different from the first protocol to effectuate an action indicated by the first API request, and
  the second selected routine and, as a result, sending one or more commands via the second network encoded in a third protocol different from the first protocol to power cycle the second group of the plurality of rack-mounted computing devices, receiving via the second network one or more power-on-self-test (POST) codes, and sending via the first network an indication of the one or more POST codes.

23. A data center, comprising:
a data center management computing device communicatively coupled to an out-of-band network; and
a plurality of racks, each rack comprising:
  a plurality of rack-mounted computing devices within the plurality of racks and communicatively coupled to an in-band network;
  a rack-controller communicatively coupled to the data center management computing device via the out-of-band network;
  a powerline network having a rack-specific network address space independent of address spaces of other powerline networks of other racks;
  a plurality of powerline modems each associated with a respective one or more of the rack-mounted computing devices; and
  a tangible, non-transitory, machine-readable medium of the rack controller storing instructions that when executed by the rack-controller effectuate operations comprising:
    receiving, with a rack-controller, via the out-of-band network, at least two requests;
    based on a first one of the requests, selecting, with the rack-controller, a first one of a plurality of routines to effectuate control via the second network of a first group of the plurality of rack-mounted computing devices, the plurality of routines including:
      first routine that reads a sensor via the second network on one of the rack-mounted computing devices;
      a second routine that reads a sensor via the second network on the rack but not on one of the rack-mounted computing devices;
      a third routine that scans computing devices on the second network and produces an inventory of the scanned computing devices on the second network;
      a fourth routine by which a configuration of an extensible firmware interface (EFI) of a given one of the rack-mounted computing device is adjusted; and
      a fifth routine by which a rack-mounted computing device is power cycled; and
    based on a second one of the requests, selecting, with the rack-controller, a second one of the plurality of routines to effectuate control via the second network of a second group of the plurality of rack-mounted computing devices, wherein the second selected routine is the fifth routine; and
  executing, with the rack-controller,
    the first selected routine and, as a result, sending one or more commands via the powerline network to effectuate an action in response to the request, and
    the second selected routine, and, as a result, sending one or more commands via the powerline network to power cycle the second group of the plurality of rack-mounted computing devices, receiving via the powerline network one or more power-on-self-test (POST) codes, and sending via the out-of-band network an indication of the one or more POST codes.

24. The medium of claim 1, wherein the second protocol is the same as the third protocol.

25. The medium of claim 1, wherein the operations comprise:
reading a component identifier from a register of a component detected by a scan of an address space of the system management bus of one of the rack-mounted computing devices for components of the one of the rack-mounted computing devices;
receiving, with the rack-controller, the component identifier;
selecting a command corresponding to a capability of the component based on the component identifier; and sending, with the rack-controller, via the second network, the selected command.

26. The method of claim 22, wherein the second protocol is the same as the third protocol.

27. The method of claim 22, wherein:
the rack-controller is an out-of-band computer having a processor, memory, and an operating system stored in persistent memory;
the rack-controller is coupled to a rack in which the rack-mounted computing devices are disposed;
the number of rack-mounted computing devices controlled by the rack-controller exceeds seven;
the rack-controller is not on the in-band network;
the first network is an out-of-band Ethernet network;
the second network is comprises a direct-current (DC) power-line network with which both power and data are conveyed via a DC power bus;
the first protocol is a hypertext transport protocol and the API is a representational state transfer API;
the sensor read by the first routine is a temperature sensor;
the configuration of the EFI specifies a boot device of the given rack-mounted computing device;
at least some of the routines do not use a baseboard management controller of the rack-mounted computing devices;
the first selected routine is the first routine; and
executing, with the rack-controller, the first selected routine comprises:
receiving, with the rack-controller, a response from the temperature sensor in units other than units of temperature;
converting, with the rack-controller, the response into units of temperature; and
sending, with the rack-controller, via the first network, an HTTP response including the converted response in units of temperature.

28. The method of claim 22, wherein:
the second network connects a control plane of a rack over which a plurality of servers mounted in the rack are controlled; and
the first network is an out-of-band network over which a data center is managed based on workload and environmental data gathered from a plurality of racks via a plurality of respective instances of the first network.

29. The method of claim 22, wherein:
the first selected routine is the third routine; and
executing, with the rack-controller, the first selected routine comprises:
sending, with the rack-controller, via the second network, to each device on the second network, a command to send an identifier; and
receiving, with the rack-controller, during each of a plurality of durations of time reserved for respective ones of the devices to use a shared physical medium of the second network, an identifier from the respective devices.

30. The method of claim 22, wherein:
the first selected routine is the third routine; and
executing, with the rack-controller, the first selected routine comprises:
sending, with the rack-controller, via the second network, and a modem coupled a mid-plane of a server, a command to a computing device coupled to the server and the modem, the command causing the computing device to execute a scan of other computing devices coupled to a system management bus of server; and
receiving, with the rack-controller, from the modem, via the second network, identifiers of at least some computing devices detected in scan.

31. The method of claim 22, wherein:
the first selected routine is the fourth routine; and
executing, with the rack-controller, the first selected routine comprises:
receiving, with the rack-controller, via the first network, a new version of the EFI;
sending, with the rack-controller, via the second network, the new version of the EFI to a given one of the rack-mounted computing devices and instructions to store the new version of the EFI at given boot target of a plurality of candidate boot targets of the given one of the rack-mounted computing devices;
sending, with the rack-controller, via the second network, to the given rack-mounted computing device, an instruction to change a boot target of the EFI to the given boot target; and
sending, with the rack-controller, via the second network, an instruction to reboot the given one of the rack-mounted computing devices.

32. The method of claim 22, wherein:
the first selected routine is the fourth routine; and
executing, with the rack-controller, the first selected routine comprises:
changing a boot target of an EFI of at least one of the rack-mounted computing devices without making the change via an Intelligent Platform Management Interface (IPMI) of at least one of the rack-mounted computing devices.

33. The method of claim 22, wherein the operations comprise:
gathering, with the rack-controller, via the second network, agentless monitoring metrics from each of the rack-mounted computing devices, the metrics including processor utilization of the respective rack-mounted computing devices, and
the agentless monitoring metrics are not reported by an operating system or a process running within the operating system of the rack-mounted computing devices, and wherein the metrics include memory utilization and an indication of processor temperature.

34. The method of claim 22, wherein:
the second network comprises at least one of:
an out-of-band power-line network by which both electrical power is supplied to the rack-mounted computing devices and by which data is exchanged; and
an out-of-band Ethernet network.

35. The method of claim 22, wherein the operations comprise:
causing a component identifier of a component of one of the rack-mounted computing devices to be read from a register of the component and conveyed via a system management bus of the one of the rack-mounted computing devices before being sent to the rack-controller via the second network;
receiving, with the rack-controller, the component identifier;
selecting a command corresponding to a capability of the component based on the component identifier; and
sending, with the rack-controller, via the second network, the selected command.

36. The method of claim 22, wherein the operations comprise:

causing a component identifier of a component of one of the rack-mounted computing devices to be read from a register of the component and conveyed via a system management bus of the one of the rack-mounted computing devices before being sent to the rack-controller via the second network, wherein reading from the register comprises querying a value of the register of the component, the component identified by a scan of an address space of the system management bus of the one of the rack-mounted computing devices.

37. The method of claim 22, wherein the operations comprise:
reading a component identifier from a register of a component detected by a scan of an address space of a system management bus of one of the rack-mounted computing devices for components of the one of the rack-mounted computing devices;
receiving, with the rack-controller, the component identifier;
selecting a command corresponding to a capability of the component based on the component identifier; and
sending, with the rack-controller, via the second network, the selected command.

38. The method of claim 22, wherein:
the rack controller is configured to be executed in a rack-mounted computing device; and
the second network comprises at least one of an out-of-band Ethernet network and an out-of-band power-line communication network.

39. The system of claim 23, wherein:
the rack-controller is an out-of-band computer having a processor and an operating system stored in persistent memory;
the rack-controller is coupled to the given rack in which the given plurality of rack-mounted computing devices are disposed;
the number of rack-mounted computing devices controlled by the rack-controller exceeds seven;
the rack-controller is not on the in-band network;
the out-of-band network is an Ethernet network;
the at least two requests are encoded in a hypertext transport protocol;
the sensor read by the first routine is a temperature sensor;
the configuration of the EFI specifies a boot device of the given rack-mounted computing device;
at least some of the routines do not use a baseboard management controller of the rack-mounted computing devices;
the first selected routine is the first routine; and
executing, with the rack-controller, the first selected routine comprises:
receiving, with the rack-controller, a response from the temperature sensor in units other than units of temperature;
converting, with the rack-controller, the response into units of temperature; and
sending, with the rack-controller, via the out-of-band network, an HTTP response including the converted response in units of temperature.

40. The system of claim 23, wherein:
the first selected routine is the third routine; and
executing, with the rack-controller, the first selected routine comprises:
sending, with the rack-controller, via the powerline network, to each device on the powerline network, a command to send an identifier; and
receiving, with the rack-controller, during each of a plurality of durations of time reserved for respective ones of the devices to use a shared physical medium of the powerline network, an identifier from the respective devices.

41. The system of claim 23, wherein:
the first selected routine is the third routine; and
executing, with the rack-controller, the first selected routine comprises:
sending, with the rack-controller, via the powerline network, and a modem coupled a mid-plane of a server, a command to a computing device coupled to the server and the modem, the command causing the computing device to execute a scan of other computing devices coupled to a system management bus of server; and
receiving, with the rack-controller, from the modem, via the powerline network, identifiers of at least some computing devices detected in scan.

42. The system of claim 23, wherein:
the first selected routine is the fourth routine; and
executing, with the rack-controller, the first selected routine comprises:
receiving, with the rack-controller, via the out-of-band network, a new version of the EFI;
sending, with the rack-controller, via the powerline network, the new version of the EFI to a given one of the rack-mounted computing devices and instructions to store the new version of the EFI at given boot target of a plurality of candidate boot targets of the given one of the rack-mounted computing devices;
sending, with the rack-controller, via the powerline network, to the given rack-mounted computing device, an instruction to change a boot target of the EFI to the given boot target; and
sending, with the rack-controller, via the powerline network, an instruction to reboot the given one of the rack-mounted computing devices.

43. The system of claim 23, wherein:
the first selected routine is the fourth routine; and
executing, with the rack-controller, the first selected routine comprises:
changing a boot target of an EFI of at least one of the rack-mounted computing devices without making the change via an Intelligent Platform Management Interface (IPMI) of at least one of the rack-mounted computing devices.

44. The system of claim 23, wherein the operations comprise:
causing a component identifier of a component of one of the rack-mounted computing devices to be read from a register of the component and conveyed via a system management bus of the one of the rack-mounted computing devices before being sent to the rack-controller via the powerline network;
receiving, with the rack-controller, the component identifier;
selecting a command corresponding to a capability of the component based on the component identifier; and
sending, with the rack-controller, via the powerline network, the selected command.

45. The system of claim 3, wherein the operations comprise:
causing a component identifier of a component of one of the rack-mounted computing devices to be read from a register of the component and conveyed via a system management bus of the one of the rack-mounted computing devices before being sent to the rack-controller via the powerline network, wherein reading from the register comprises querying a value of the register of the component, the component identified by a scan of an address space of the system management bus of the one of the rack-mounted computing devices.

46. The system of claim 23, wherein the operations comprise:
reading a component identifier from a register of a component detected by a scan of an address space of a system management bus of one of the rack-mounted computing devices for components of the one of the rack-mounted computing devices;
receiving, with the rack-controller, the component identifier;
selecting a command corresponding to a capability of the component based on the component identifier; and
sending, with the rack-controller, via the powerline network, the selected command.

47. A tangible, non-transitory, machine-readable medium storing instructions that when executed by one or more processors of a rack-controller effectuate operations to control a plurality of rack-mounted computing devices, the operations comprising:
receiving, with the rack-controller, via a first network, an application program interface (API) request, wherein:
the rack-controller is configured to control the plurality of rack-mounted computing devices mounted in a plurality of different rack units of one or more racks;
the rack-controller is configured to control the rack-mounted computing devices via a second network, different from the first network;
the rack-controller includes a gateway between the first network and the second network;
the rack-controller is configured to cause a component identifier of a component of one of the rack-mounted computing devices to be read from a register of the component and conveyed via a system management bus of the one of the rack-mounted computing devices before being sent to the rack-controller via the second network;
the rack-controller is configured to receive the component identifier;
the second network is an out-of-band network distinct from an in-band network with which data is conveyed between rack-mounted computing devices or between rack-mounted computing devices and the internet; and
the API request is encoded in a first protocol;
based on the API request, selecting, with the rack-controller, one of a plurality of routines to effectuate control via the second network of at least some of the plurality of rack-mounted computing devices, the plurality of routines including:
a first routine that reads a sensor via the second network on one of the rack-mounted computing devices;
a second routine that reads a sensor via the second network on the rack but not on one of the rack-mounted computing devices;
a third routine that scans computing devices on the second network and produces an inventory of the scanned computing devices on the second network; and
a fourth routine by which a configuration of an extensible firmware interface (EFI) of a given one of the rack-mounted computing device is adjusted; and
executing, with the rack-controller, the selected routine and, as a result, sending one or more commands via the second network encoded in a second protocol different from the first protocol to effectuate an action indicated by the API request, wherein sending at least one of the commands comprises selecting a command corresponding to a capability of the component based on the component identifier.

48. The medium of claim 47, wherein:
reading from the register comprises querying a value of the register of the component, the component identified by a scan of an address space of the system management bus of the one of the rack-mounted computing devices.

* * * * *